(12) United States Patent
Kuroki

(10) Patent No.: US 7,326,595 B2
(45) Date of Patent: Feb. 5, 2008

(54) SEMICONDUCTOR INTEGRATED CIRCUIT AND METHOD OF REDESIGNING SAME

(75) Inventor: Ryuta Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 134 days.

(21) Appl. No.: 11/039,918

(22) Filed: Jan. 24, 2005

(65) Prior Publication Data

US 2005/0199915 A1  Sep. 15, 2005

(30) Foreign Application Priority Data

Mar. 10, 2004  (JP) .............................. 2004-067918

(51) Int. Cl.
*H01L 21/82* (2006.01)
(52) U.S. Cl. ...................... 438/128; 438/129; 257/204; 257/206; 257/E21.526
(58) Field of Classification Search ................ 257/204, 257/206, E21.526; 438/128, 129
See application file for complete search history.

(56) References Cited

U.S. PATENT DOCUMENTS 6,252,427 B1 *  6/2001  Domae et al. .............. 326/121

2004/0007743 A1 *  1/2004  Matsuda et al. ............ 257/369

FOREIGN PATENT DOCUMENTS

JP         07-130858    5/1995
WO     WO 00/05764   2/2000

* cited by examiner

*Primary Examiner*—Phat X Cao
(74) *Attorney, Agent, or Firm*—Rabin & Berdo, P.C.

(57) ABSTRACT

A semiconductor integrated circuit has a first functional block, a second functional block, and a signal line routed from the first functional block to the second functional block in a metal interconnection layer. A complementary pair of metal-oxide-semiconductor circuits with source, gate, and drain terminals are located near the signal line between the first and second functional blocks. The drain terminals extend to the same metal interconnection layer as the signal line, but are not connected to the signal line. The circuit can be redesigned to invert the signal transmitted on the signal line by altering a single mask defining the metal interconnection layer, so as to divide the signal line into a first part connected to the gate terminals and a second part connected to the drain terminals of the complementary pair of metal-oxide-semiconductor circuits.

20 Claims, 10 Drawing Sheets

SEMICONDUCTOR INTEGRATED CIRCUIT AND METHOD OF REDESIGNING SAME

BACKGROUND OF THE INVENTION

1. Field of the Invention

The present invention relates to the structure of a semiconductor integrated circuit and a method of changing the structure by modifying just one mask used to define a metal interconnection layer, thereby altering the logic functions of the integrated circuit.

2. Description of the Related Art

The need to alter the logic of an integrated circuit arises sometimes because of a change in specifications during the design stage, sometimes because of the discovery of faults during functional tests in the manufacturing stage, and sometimes for various other reasons. Such alterations are time-consuming and expensive because they require the layout of the circuit to be changed.

The basic problem is illustrated in FIG. 1, which is a simplified plan view of part of a conventional integrated circuit. The hatched regions 10, 12, 14 are patterns in a metal layer overlying a semiconductor substrate. Power is supplied at the power supply potential (VDD) from a metal power supply pattern 10, and at the ground potential (VSS) from a metal ground pattern 14, to a first functional block A disposed in a first region 16 and a second functional block B disposed in a second region 18. A signal output from the first functional block A is directly input to the second functional block B through a metal pattern 12. If the logic of this signal needs to be inverted because of a problem discovered after the circuit layout has been completed, or after functional testing has been completed, it becomes necessary to insert an inverter cell, comprising a p-channel metal-oxide-semiconductor (PMOS) transistor and an n-channel metal-oxide-semiconductor (NMOS) transistor, between blocks A and B, but blocks A and B have been laid out close together, as is normal, and there is not enough space between them to accommodate the additional transistors. Accordingly, in order to insert the inverter cell, blocks A and B must be relocated to widen the space between them, possibly requiring other circuit blocks to be moved as well. In the worst case, the layout of the entire integrated circuit has to be redesigned. In any case, to relocate blocks A and B, all of the photolithography masks used in the integrated circuit fabrication process must be altered, an expensive and time-consuming process.

Japanese Unexamined Patent Application Publication No. H07-130858 discloses a method of simplifying such alterations by designing extra diffusion regions and gate terminals into a cell-based integrated circuit, below the metal power and ground patterns outside the cells, so that transistors and logic gates can be added, if necessary, without changing the cell layout. This type of alteration, however, requires the addition of new signal lines, so it is still necessary to modify at least two photolithography masks: one mask used to define an interconnection pattern in a metal interconnection layer, and another mask used to define a contact hole pattern (or a through hole pattern) in a dielectric layer.

Patent Cooperation Treaty Patent Application Publication No. WO00/05764 discloses a so-called master-slice method in which a wafer of semiconductor integrated circuits is processed up to the stage in which metal interconnections are formed, and then the interconnections, protective layers, and so on are formed according to user specifications in such a way that signal lines are not routed over power and ground lines. A design change therefore affects only the metal interconnection layers, but a change such as the insertion of an inverter still requires the modification of at least two photolithography masks and may require extensive layout changes as described above.

It would be desirable for simple design changes, such as the insertion of an inverter, to be made by simple modifications to a single photolithography mask, without requiring any changes in the layout of existing circuit blocks.

SUMMARY OF THE INVENTION

An object of the present invention is to provide a semiconductor integrated circuit with a layout that simplifies the redesign of the integrated circuit when a problem is discovered after the layout of the integrated circuit has been completed, or after functional testing of the integrated circuit has been completed.

A more specific object is to enable design changes to be made by simple modification of a single photolithography mask.

The present invention provides a semiconductor integrated circuit having a first functional block, a second functional block, and a signal line disposed in a metal interconnection layer for transmitting a signal from the first functional block to the second functional block. A PMOS circuit disposed between the first and second functional blocks has source, gate, and drain terminals, the drain terminal extending to the metal interconnection layer at a point separated by a first space from the signal line. An NMOS circuit, likewise disposed between the first and second functional blocks, also has source, gate, and drain terminals, the drain terminal extending to the metal interconnection layer at a point separated by a second space from the signal line. The first space and the second space are devoid of metal signal lines in this metal interconnection layer.

This semiconductor integrated circuit can be redesigned to invert the signal carried on the signal line by modifying a single mask defining the metal interconnection layer so as to remove an intermediate part of the signal line, thereby dividing the signal line into a first part receiving the signal from the first functional block and a second part transmitting the signal to the second functional block. The mask modification also connects the drain terminals of the PMOS and NMOS circuits to the second part of the signal line. The modification does not require any changes in the layout of the first and second functional blocks.

The semiconductor integrated circuit preferably has a power supply pattern and a ground pattern disposed in the metal interconnection layer, in which case the PMOS circuit's source terminal may be connected to the power supply pattern, and the NMOS circuit's source terminal may be connected to the ground pattern. The drain terminal of the PMOS circuit is preferably also connected to the power supply pattern, and the drain terminal of the NMOS circuit is preferably connected to the ground pattern. When the semiconductor integrated circuit is redesigned to invert the signal carried on the signal line as described above, the drain terminals are disconnected from the power supply and ground patterns. The modification still requires the change of only a single mask.

The gate terminals of the PMOS and NMOS circuits may both be connected to the signal line, or may both be disconnected from the signal line. In the latter case, the gate terminals still extend to the metal interconnection layer, and if the semiconductor integrated circuit is redesigned to invert the signal carried on the signal line, the mask defining the metal interconnection layer is modified to connect the gate terminals to the signal line.

The PMOS and NMOS circuits may be enlarged to include additional gate and drain terminals, which are connected so as to insert an inverter stage on the signal line leading to the first functional block. The resulting two-stage circuit can still be modified in the manner as described above, by altering only a single mask.

The invention also provides a method of modifying an inverter, by interconnecting its input and output terminals and disconnecting its drain terminals from the output terminal, to obtain one of the circuits described above.

DETAILED DESCRIPTION OF THE INVENTION

Figure 1:
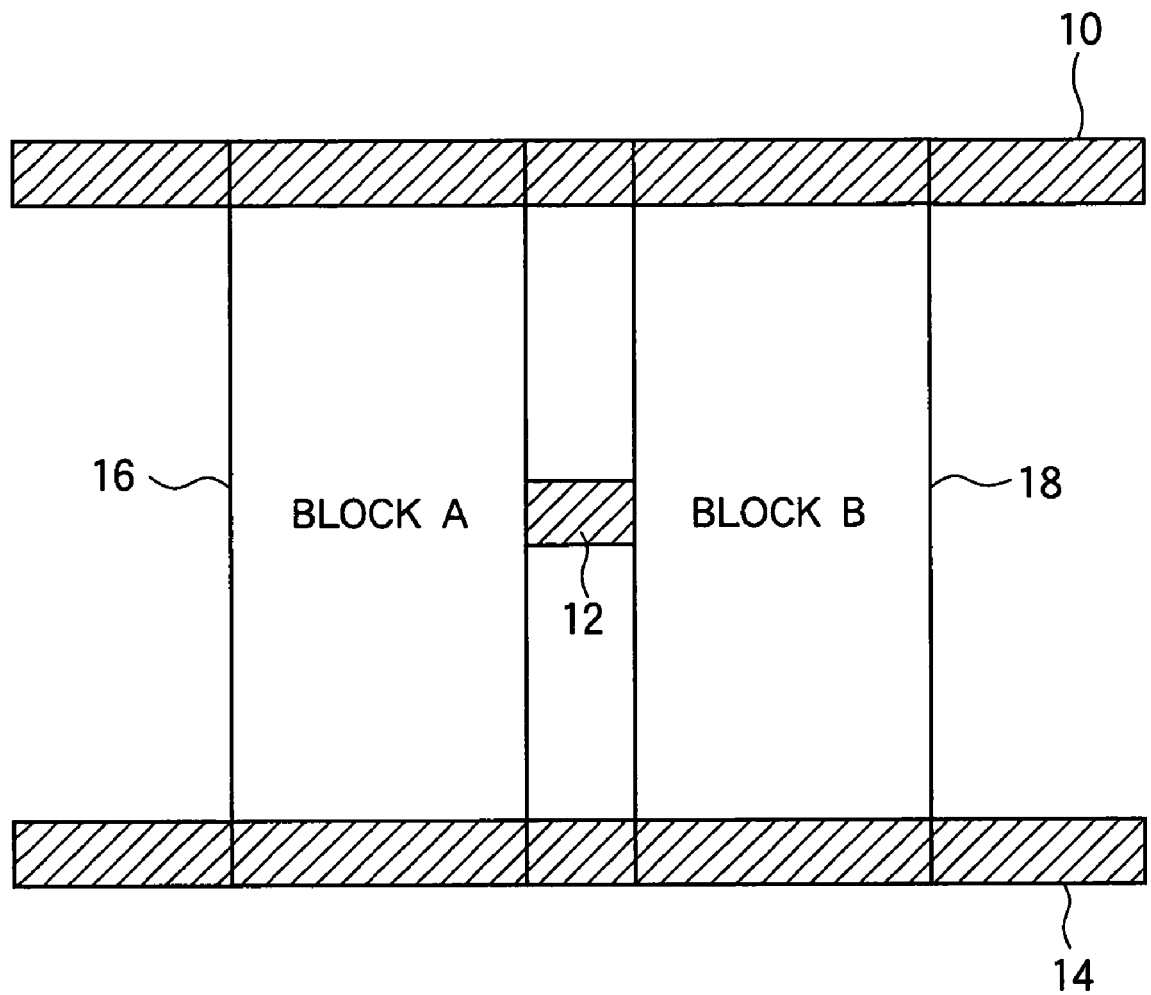
FIG. 1 illustrates part of a conventional integrated circuit.

Preferred embodiments of the invention will now be described with reference to the attached drawings, in which like elements are indicated by like reference characters. The drawings illustrate the embodiments schematically, to enable the invention to be understood; the sizes, shapes, and positional relationships of the constituent elements depicted in the drawings are not necessarily shown exactly as they will appear when the invention is practiced.

In the following description, the power supply potential (VDD) may be referred to as the first potential, and the ground potential (VSS) as the second potential. The region in which the first functional block is located may be referred to as the first region, and the region in which the second functional block is located as the second region. The source, gate, and drain terminals of the PMOS circuit disposed between the first and second functional blocks may be referred to as the first source terminal, first gate terminal, and first drain terminal; the source, gate, and drain terminals of the NMOS circuit disposed between the first and second functional blocks may be referred to as the second source terminal, second gate terminal, and second drain terminal. In the descriptions of the fifth to eighth embodiments, in which the PMOS and NMOS circuits have two gate terminals and two drain terminals apiece, the gate and drain terminals of the PMOS circuit may be referred to as the first and second gate and drain terminals, and the gate and drain terminals of the NMOS circuit as the third and fourth gate and drain terminals.

FIRST EMBODIMENT

Figure 2A:
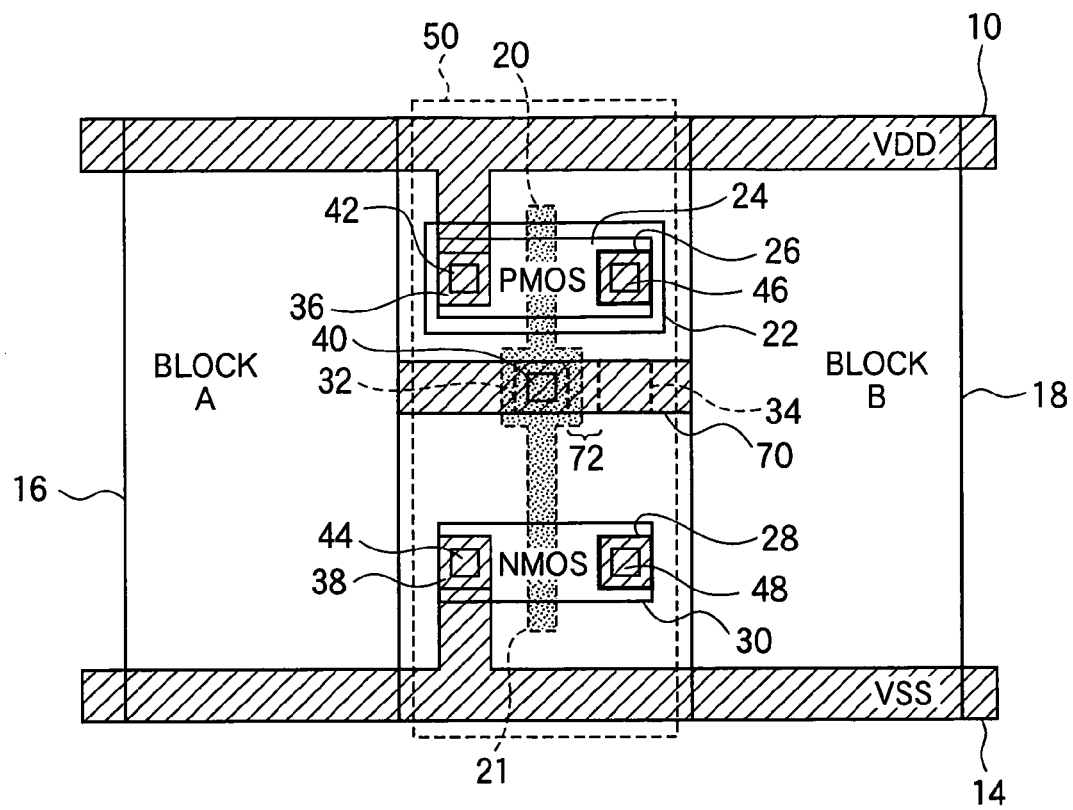
FIG. 2A illustrates the partial layout of a first integrated circuit embodying the present invention.

A first integrated circuit embodying the present invention will be described with reference to the interconnection pattern layout diagram in FIG. 2A and the schematic circuit diagram in FIG. 2B.

The first integrated circuit includes a first functional block A disposed in a first region 16 and a second functional block B disposed in a second region 18. The first and second regions 16, 18 are separated by a modification region 50 including a buffer cell 52 that conveys a signal from functional block A to functional block B. Power is supplied to functional blocks A and B and the buffer cell 52 at the power supply potential (VDD) from a metal power supply pattern 10, and at the ground potential (VSS) from a metal ground pattern 14.

The buffer cell includes a PMOS circuit and an NMOS circuit with respective gate electrodes 20, 21. The PMOS circuit is formed in a p-well 22 into which p-type ions are implanted. The PMOS circuit includes a p-type active region 24, a source terminal 36 connected to the metal power supply pattern 10, and an unconnected drain terminal 26 indicated in FIG. 2A by a thick line. The part of the modification area 50 external to the p-well 22 functions as the NMOS circuit area. The NMOS circuit includes an n-type active region 30, a source terminal 38 connected to the metal ground pattern 14, and an unconnected drain terminal 28 indicated by another thick line. A metal signal line pattern 70 extends through the buffer cell 52 from functional block A to functional block B, running parallel to and between the two active areas 24, 30. Two parts of the metal signal line pattern 70, indicated by dashed lines in FIG. 2A, function as an input terminal 32 and an output terminal 34 of the buffer cell 52.

The metal signal line pattern 70, the input and output terminals 32, 34, the drain terminals 26, 28, the source terminals 36, 38, and the metal power supply and ground patterns 10, 14 are all part of a single metal interconnection layer that is insulated from the gate electrodes 20, 21 and active regions 24, 30 by an interlayer dielectric film, not explicitly shown in the drawings. The gate electrodes 20, 21 are mutually conjoined and are electrically connected to the input terminal 32 through a contact hole 40 in the interlayer dielectric film. The input terminal 32 thus also functions as a gate terminal for the PMOS and NMOS circuits. Similarly, the source terminals 36, 38 are electrically connected to the active regions 24, 30 through contact holes 42, 44, and the drain terminals 26, 27 are electrically connected to the active regions 24, 30 through contact holes 46, 48.

The source terminals 36, 38 of the PMOS and NMOS circuits include conductive plugs filling contact holes 42, 44. Similarly, the drain terminals 26 and 28 include conductive plugs filling contact holes 46, 48. The gate terminals include the input terminal 32, a conductive plug filling contact hole 40, and the gate electrodes 20, 21.

Figure 2B:
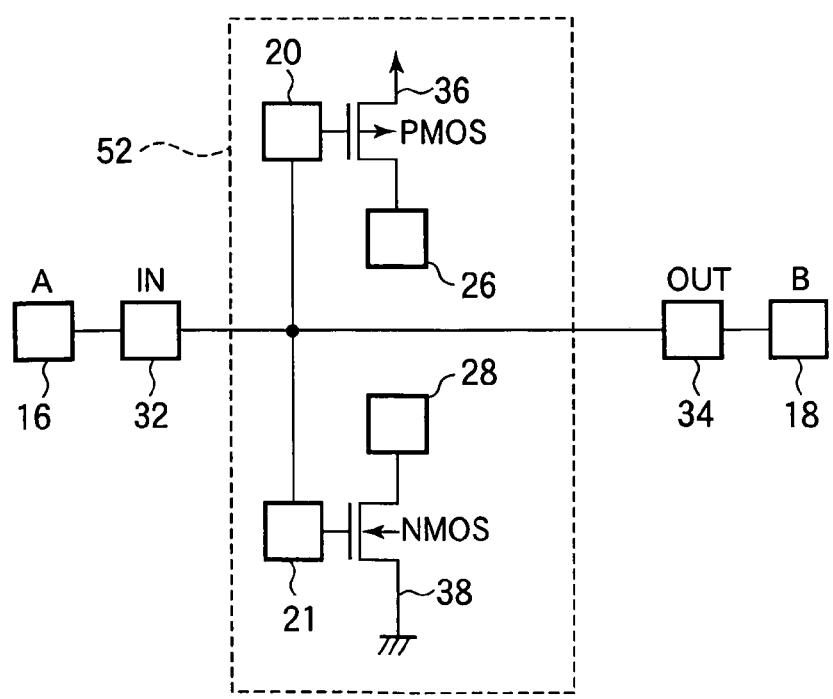
FIG. 2B is a circuit diagram of the layout in FIG. 2A.

In FIG. 2B, the input terminal 32 and output terminal 34 are schematically shown outside the buffer cell 52, indicating that the input terminal 32 can also be considered as an output terminal of the first functional block A and the output terminal 34 as an input terminal of the second functional block B. The circuit topology in FIG. 2B is the same as in FIG. 2A.

The buffer cell 52 receives a signal output from block A at its input terminal 32 and outputs the same signal to block B from its output terminal 34. The PMOS and NMOS circuits do not participate in this signal transmitting operation, but they provide facilities for modifying the buffer cell if necessary.

In the first integrated circuit, the metal signal line pattern 70 is the only metal interconnecting line that crosses the space between the drain terminals 26 and 28. The spaces between the metal signal line pattern 70 and the drain terminals 26, 28 of the PMOS and NMOS circuits are devoid of other signal lines in this metal interconnection layer, so there is nothing to hinder the routing of a new metal line interconnecting the drains 26, 28 of the PMOS and NMOS circuits and the output terminal 34. Accordingly, although the drain terminal 26 of the PMOS circuit and the drain terminal 28 of the NMOS circuit are not connected in the first integrated circuit, they could be easily connected to each other, and to the output terminal 34, by altering the metal interconnection layer including metal signal line pattern 70.

The buffer cell 52 can therefore be redesigned to function as an inverter cell by eliminating the part 72 of the metal signal line 70 between the input and output terminals 32, 34, thereby disconnecting the input terminal 32 from the output terminal 34, and connecting the drain terminal 26 of the PMOS circuit and the drain terminal 28 of the NMOS circuit to the output terminal 34 by a new metal interconnecting line. This modification does not change the fixed layout of the input terminal 32, the output terminal 34, the PMOS circuit, and the NMOS circuit. If the buffer cell 52 is altered in this way to function as an inverter cell, the first integrated circuit becomes a second integrated circuit, which will be described below with reference to FIGS. 3A and 3B.

The first integrated circuit can be redesigned in this way by the modification of just one photolithography mask, this being the mask that defines the metal interconnection layer including metal signal line pattern 70. The mask modification is extremely simple, being limited to the area between the drain terminal 26 of the PMOS circuit and the drain terminal 28 of the NMOS circuit, and between the input terminal 32 and the output terminal 34, and can be made without changing the existing layout of the functional blocks A and B in the first region 16 and second region 18. In a computer-aided engineering environment, the entire modification can be completed in two simple redesign steps: in the first step, the input terminal is disconnected from the output terminal, without changing any other interconnections; in the second step, the first and second drain terminals are both interconnected to the output terminal of the buffer cell, which is the input terminal of the second functional block B, again without changing any other interconnections.

SECOND EMBODIMENT

A second integrated circuit embodying the present invention will be described with reference to the interconnection pattern layout diagram in FIG. 3A and the schematic circuit diagram in FIG. 3B.

The second integrated circuit includes a first functional block disposed in a first region, a second functional block disposed in a second region, and two circuits disposed between the first and second regions: a PMOS circuit having a first source terminal connected to a first power supply, a first gate terminal connected to an output terminal of the first functional block, and a first drain terminal connected to an input terminal of the second functional block, and an NMOS circuit having a second source terminal connected to a second power supply, a second gate terminal connected to an output terminal of the first functional block, and a second drain terminal connected to an input terminal of the second functional block.

Figure 3A:
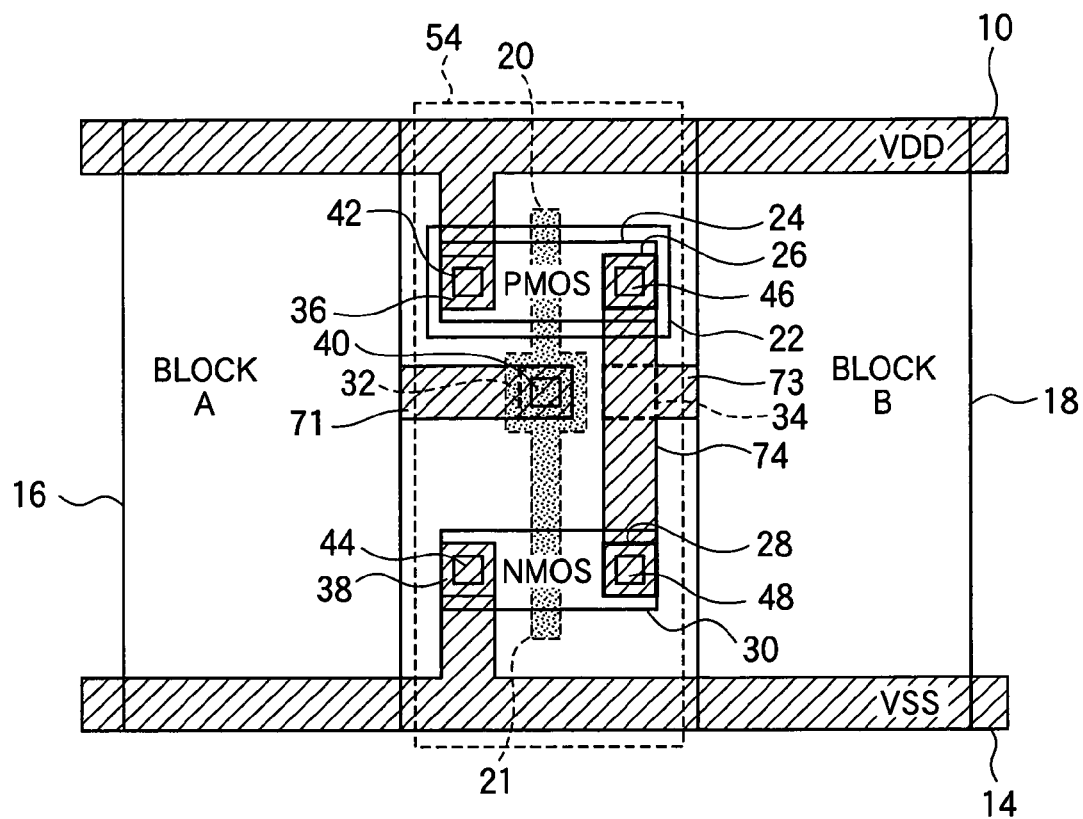
FIG. 3A illustrates the partial layout of a second integrated circuit embodying the present invention.
Figure 3B:
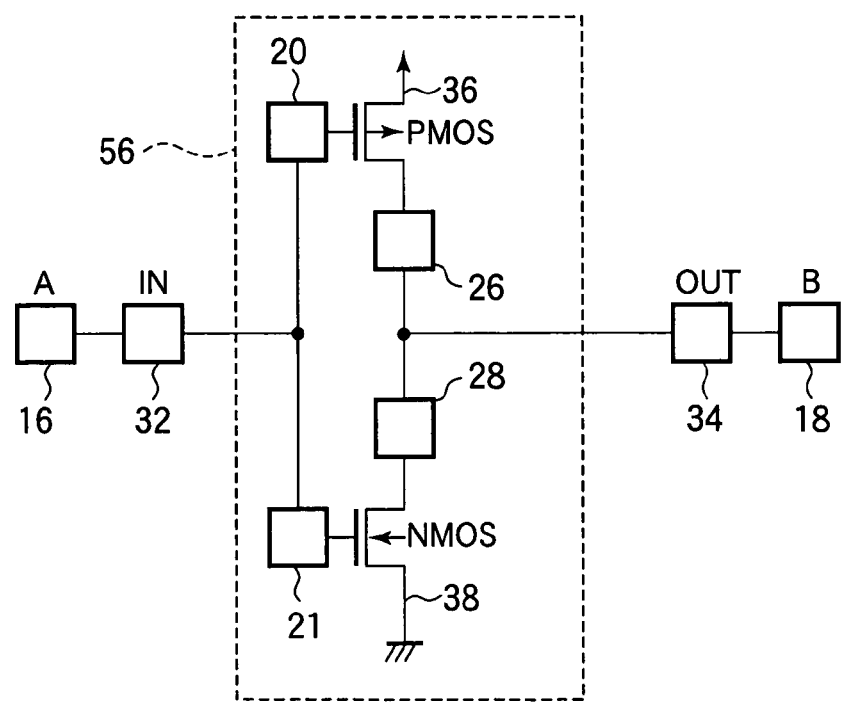
FIG. 3B is a circuit diagram of the layout in FIG. 3A.

The first and second functional blocks A and B are disposed in respective regions 16, 18 in FIG. 3A, separated by a modification area 54. An inverter cell 56 is disposed in the modification area 54, instead of the buffer cell 52 in the first integrated circuit. The unmodified second integrated circuit is identical to the modified form of the first integrated circuit: the input terminal 32 is connected to the first functional block A by a metal signal line 71; the output terminal 34 is connected to the second functional block B by a separate metal signal line 73; the drain terminal 26 of the PMOS circuit and the drain terminal 28 of the NMOS circuit are connected to the output terminal 34 by a metal pattern 74; the input terminal 32 is disconnected from the output terminal 34.

The power supply and ground patterns 10, 14, input and output terminals 32, 34, source terminals 36, 38, drain terminals 26, 28, and metal patterns 71, 73, 74 are disposed in a single metal interconnection layer, with electrical connections to the gate electrodes 20, 21 and active regions 24, 30 formed through contact holes 40, 42, 44, 46, 48 as in the first embodiment.

In the second integrated circuit, no metal pattern is disposed in or crosses the space between the input terminal 32 and the output terminal 34, so the input terminal 32 and the output terminal 34 could be easily connected to each other by altering the metal layer including metal pattern 74. If, in addition, part of metal pattern 74 is eliminated to disconnect the drain terminal 26 of the PMOS circuit and the drain terminal 28 of the NMOS circuit from the output terminal 34, without changing the fixed layout of the input terminal 32, the output terminal 34, the PMOS circuit, and the NMOS circuit, the inverter cell 56 functions as a buffer cell 52.

The second integrated circuit described above can be modified in this way by the alteration of just one photolithography mask, this being the mask that defines the layer of metal interconnecting lines including metal pattern 74. The modification is extremely simple, being limited to the area (in which metal pattern 74 is disposed) between the drain terminal 26 of the PMOS circuit and the drain terminal 28 of the NMOS circuit and the area (of metal pattern 72 in FIG. 2A) between the input terminal 32 and the output terminal 34. As in the first integrated circuit, the modification can be made without changing the existing layout of the first and second functional blocks A and B.

THIRD EMBODIMENT

A third integrated circuit embodying the present invention will be described with reference to the interconnection pattern layout diagram in FIG. 4A and the schematic circuit diagram in FIG. 4B.

The third integrated circuit includes a first functional block disposed in a first region, a second functional block disposed in a second region, and two circuits disposed between the first and second regions: a PMOS circuit having a first source terminal connected to the first power supply, a first gate terminal connected to an output terminal of the first functional block, and a first drain terminal connected to the first power supply, and an NMOS circuit having a second source terminal connected to the second power supply, a second gate terminal connected to the output terminal of the first functional block, and a second drain terminal connected to the second power supply. The gate terminals are also connected to an input terminal of the second functional block.

Figure 4A:
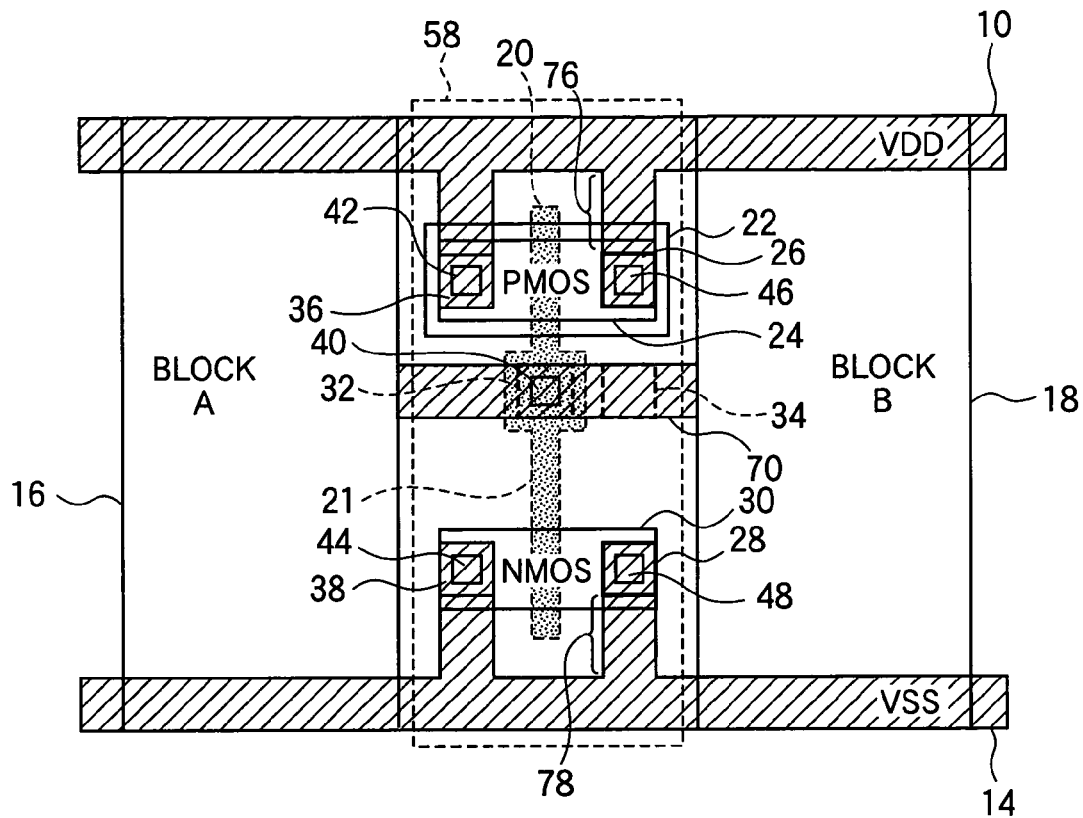
FIG. 4A illustrates the partial layout of a third integrated circuit embodying the present invention.
Figure 4B:
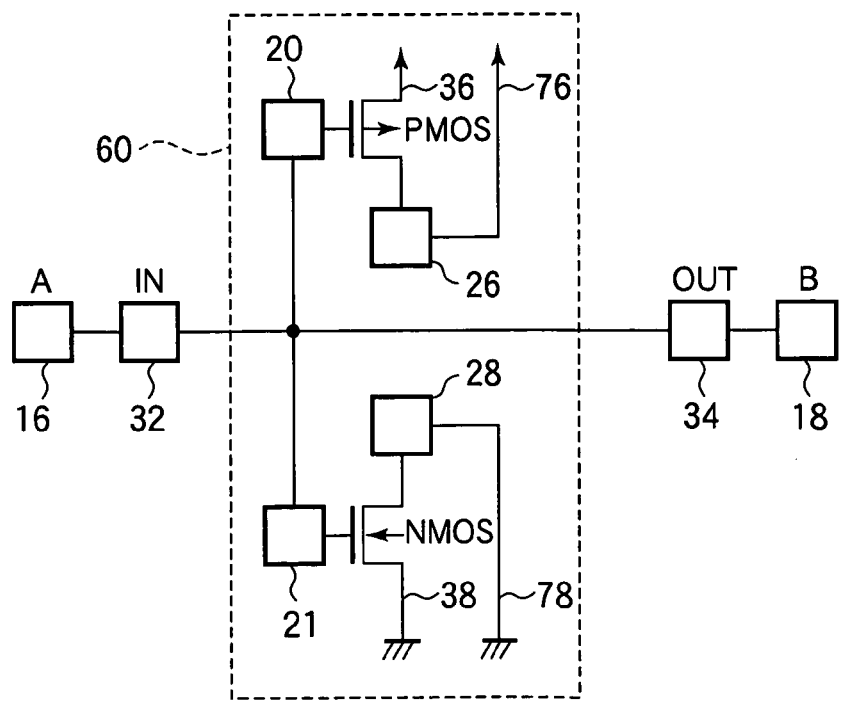
FIG. 4B is a circuit diagram of the layout in FIG. 4A.

The first and second functional blocks A and B are disposed in respective regions 16, 18 in FIG. 4A, separated by a modification area 58. A buffer cell 60 is disposed in the modification area 58.

The buffer cell 60 includes the PMOS circuit, the NMOS circuit, and a metal signal line pattern 70 with input and output terminals 32, 34 interconnecting functional blocks A and B. As in the first integrated circuit, the output terminal 34 is connected to the input terminal 32, and is disconnected from the drain terminals 26, 28 of the PMOS and NMOS circuits. Differing from the first integrated circuit, power is supplied at the power supply potential (VDD) to the drain terminal 26 of the PMOS circuit from metal power supply pattern 10 by a metal pattern 76, and at the ground potential (VSS) to the drain terminal 28 of the NMOS circuit from metal ground pattern 14 by a metal pattern 78. The power supply and ground patterns 10, 14, input and output terminals 32, 34, source terminals 36, 38, drain terminals 26, 28, and metal patterns 70, 76, 78 are disposed in a single metal interconnection layer, with electrical connections to the gate electrodes 20, 21 and active regions 24, 30 formed through contact holes 40, 42, 44, 46, 48 as in the first embodiment.

The buffer cell 60 can be altered to function as an inverter cell by connecting the drain terminal 26 of the PMOS circuit and the drain terminal 28 of the NMOS circuit to the output terminal 34 by a new metal interconnecting line, disconnecting the input terminal 32 from the output terminal 34 by eliminating one part 72 of the metal signal line pattern 70, disconnecting the drain terminal 26 of the PMOS circuit from metal power supply pattern 10 by eliminating metal pattern 76, and disconnecting the drain terminal 28 of the NMOS circuit from metal ground pattern 14 by eliminating metal pattern 78. None of these modifications change the fixed layout of the input terminal 32, the output terminal 34, the PMOS circuit, and the NMOS circuit.

The third integrated circuit can be modified as described above by the alteration of the single photolithography mask that defines the layer of metal interconnecting lines including metal patterns 70, 76, and 78. The modification is extremely simple, being limited to the area between the drain terminal 26 of the PMOS circuit and the drain terminal 28 of the NMOS circuit, between the input terminal 32 of the buffer cell 60 and the output terminal 34, between the drain terminal 26 and metal power supply pattern 10, and between the drain terminal 28 and metal ground pattern 14, and can be made without changing the existing layout of the first functional block A and the second functional block B, as in the first integrated circuit.

Because power is supplied at the power supply potential (VDD) to the drain terminal 26 of the PMOS circuit from metal power supply pattern 10 by metal pattern 76, and at the ground potential (VSS) to the drain terminal 28 of the NMOS circuit from metal ground pattern 14 by metal pattern 78, although in the first integrated circuit there was space to route another metal line between the drain terminal 26 of the PMOS circuit and the metal power supply pattern 10 and between the drain terminal 28 of the NMOS circuit and the metal ground pattern 14, this cannot be done in the third integrated circuit.

In the third integrated circuit, however, the PMOS and NMOS circuits are not electrically floating. More specifically, since power is supplied at the power supply potential (VDD) to the drain terminal 26 of the PMOS circuit, and at the ground potential (VSS) to the drain terminal 28 of the NMOS circuit, the drain terminals 26 and 28 are not unconnected terminals with indeterminate potentials. As a result, no pseudo errors caused by indeterminate potentials occur in verification tests such as the layout versus schematic comparison test and electrical tests. These tests can accordingly carried out without having to tie down so-called floating transistors by tying their unconnected terminals to the power supply potential (VDD) or the ground potential (VSS); further details will be given in the next embodiment.

FOURTH EMBODIMENT

A fourth integrated circuit embodying the present invention will be described with reference to the interconnection pattern layout diagram in FIG. 5A and the schematic circuit diagram in FIG. 5B.

The fourth integrated circuit includes a first functional block disposed in a first region, a second functional block disposed in a second region, a signal line connecting an input terminal of the first functional block to an output terminal of the second functional block, and two circuits disposed between the first and second regions: a PMOS circuit having a first source terminal connected to the first power supply, a first gate terminal, and a first drain terminal connected to the first power supply, and an NMOS circuit having a second source terminal connected to the second power supply, a second gate terminal, and a second drain terminal connected to the second power supply.

Figure 5A:
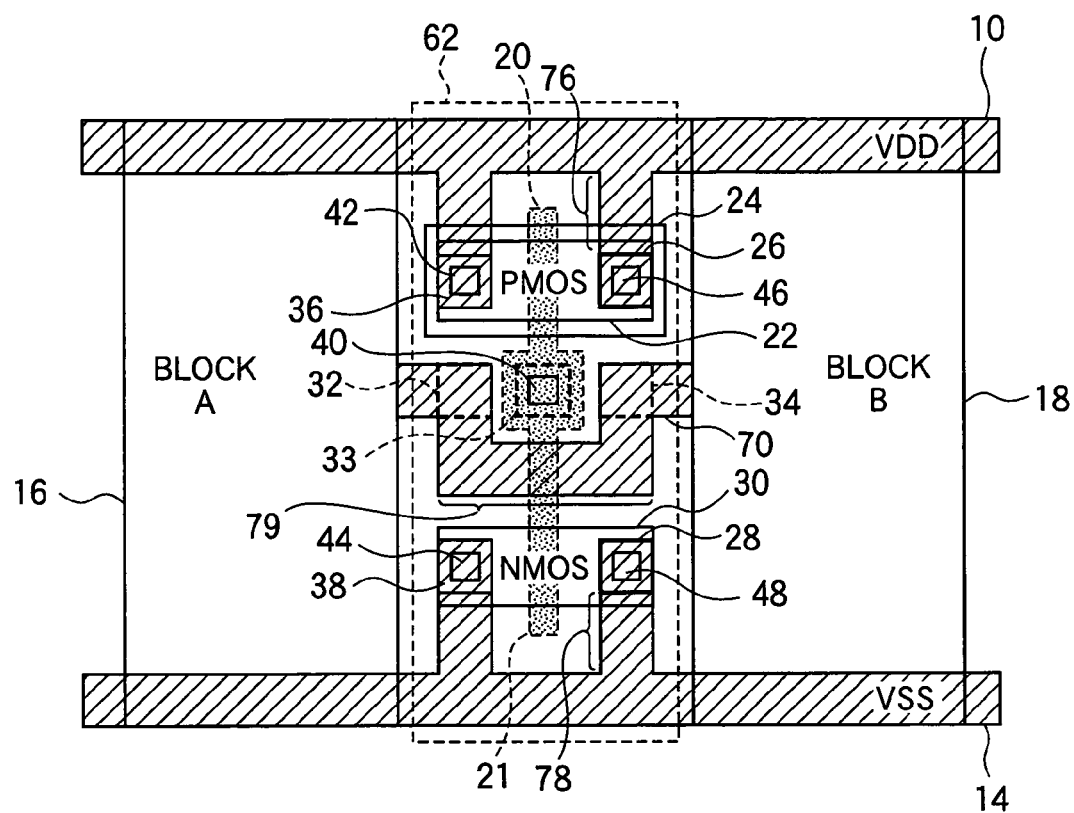
FIG. 5A illustrates the partial layout of a fourth integrated circuit embodying the present invention.

The first and second functional blocks A and B are disposed in respective regions 16, 18 in FIG. 5A, separated by a modification area 62. A buffer cell 64 including the PMOS circuit and the NMOS circuit is disposed in the modification area 62. Power supply and ground patterns 10, 14, input and output terminals 32, 34, source terminals 36, 38, drain terminals 26, 28, and metal patterns 70, 76, 78 are disposed in a single metal interconnection layer and are laid out generally as in the third integrated circuit, with electrical connections to the gate electrodes 20, 21 and active regions 24, 30 formed through contact holes 40, 42, 44, 46, 48. Metal pattern 76 holds the drain terminal 26 of the PMOS circuit held at the power supply potential (VDD); metal pattern 78 holds the drain terminal 28 of the NMOS circuit at the ground potential (VSS). Differing from the third integrated circuit, the input terminal 32 in the metal signal line pattern 70 interconnecting functional blocks A and B is separate from the gate terminal 33 of the buffer cell 64. Metal signal line 70 bypasses the gate terminal 33, and is electrically disconnected from the gate electrodes 20, 21.

The gate terminal 33 need not be metalized, although the underlying contact hole 40 is filled with a conductive plug.

The buffer cell 64 can be altered to function as an inverter cell by connecting the drain terminal 26 of the PMOS circuit and the drain terminal 28 of the NMOS circuit to the output terminal 34 by a new metal interconnecting line, disconnecting the drain terminal 26 of the PMOS circuit from metal power supply pattern 10 by eliminating metal pattern 76, disconnecting the drain terminal 28 of the NMOS circuit from metal ground pattern 14 by eliminating metal pattern 78, disconnecting the input terminal 32 from the output terminal 34 by eliminating the part 79 of the metal signal line pattern 70 that interconnects these terminals 32, 34, metalizing the gate terminal 33, and connecting the input terminal 32 to the gate terminal 33, without changing the fixed layout of the input terminal 32, the output terminal 34, the PMOS circuit, and the NMOS circuit.

The fourth integrated circuit can therefore be modified as described above by the alteration of the single photolithography mask that defines the layer of metal interconnecting lines including metal patterns 70, 76, and 78. The modification is limited to the modification area 62, more specifically to the area between the drain terminal 26 of the PMOS circuit and the drain terminal 28 of the NMOS circuit, the area around the gate terminal 33, and the areas between the drain terminal 26 and metal power supply pattern 10 and between the drain terminal 28 and metal ground pattern 14. As in the third integrated circuit, this simple modification can be made without changing the existing layout of the first functional block A and the second functional block B.

As the input terminal 32 of the buffer cell 64 is not connected to the gate electrodes 20, 21, the signal propagation speed between the input terminal 32 and output terminal 34 is substantially increased, because signals are not slowed by the gate capacitance of the PMOS and NMOS circuits 22, 30. The reason for this speed increase and the reason why floating transistors need to be tied down during verification tests will be explained below, taking the NMOS circuit as an example. Since the potential relationships between the source, gate, and drain terminals of the PMOS circuit are the reverse of the potential relationships between the source, gate, and drain terminals of the NMOS circuit, the same explanation also applies to the PMOS circuit.

Figure 6A:
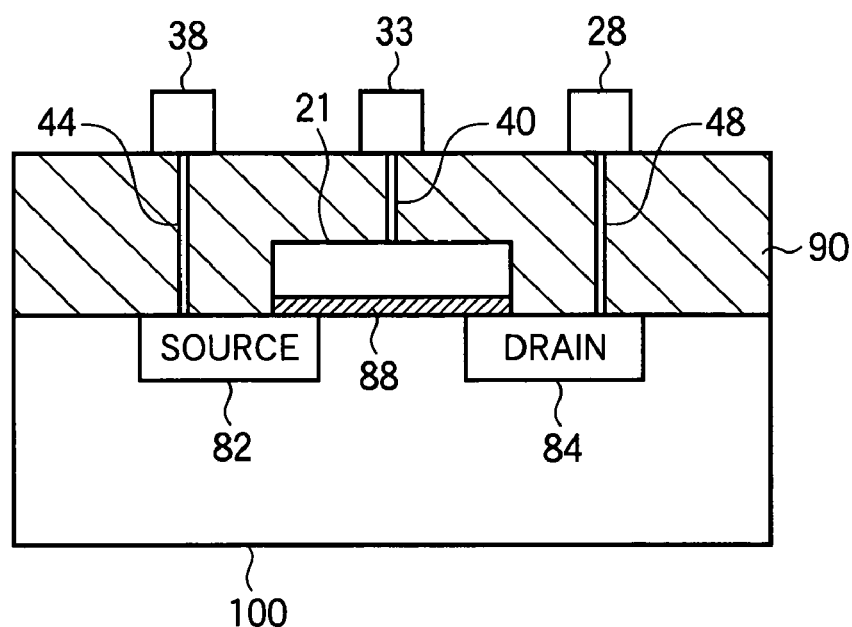
FIG. 6A is a sectional view of a transistor.
Figure 6B:
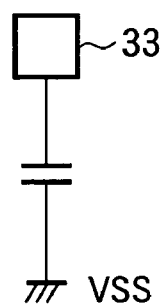
FIG. 6B is a circuit diagram indicating the gate capacitance of the transistor in FIG. 6A.

Referring to the sectional view of the NMOS circuit in FIG. 6A, the source diffusion 82 and drain diffusion 84 in the active area of the semiconductor substrate 100 are separated from the gate electrode 21 by a thin dielectric film 88. The substrate 100 and gate electrode 21 are separated from the gate terminal 33, source terminal 38, and drain terminal 28 by the thicker interlayer dielectric film 90. The structure shown in FIG. 6A, in which the conductive gate terminal is separated from the conductive source diffusion 82, drain diffusion 84, and substrate 100 by a thin dielectric film, is that of a capacitor. Since the source diffusion 82 and drain diffusion 84 (and substrate 100) are held at the ground potential VSS, the NMOS circuit is functionally equivalent to a capacitor with one grounded electrode, as shown in the schematic circuit diagram in FIG. 6B; the gate capacitance of the NMOS circuit is the capacitance of this capacitor.

Figure 5B:
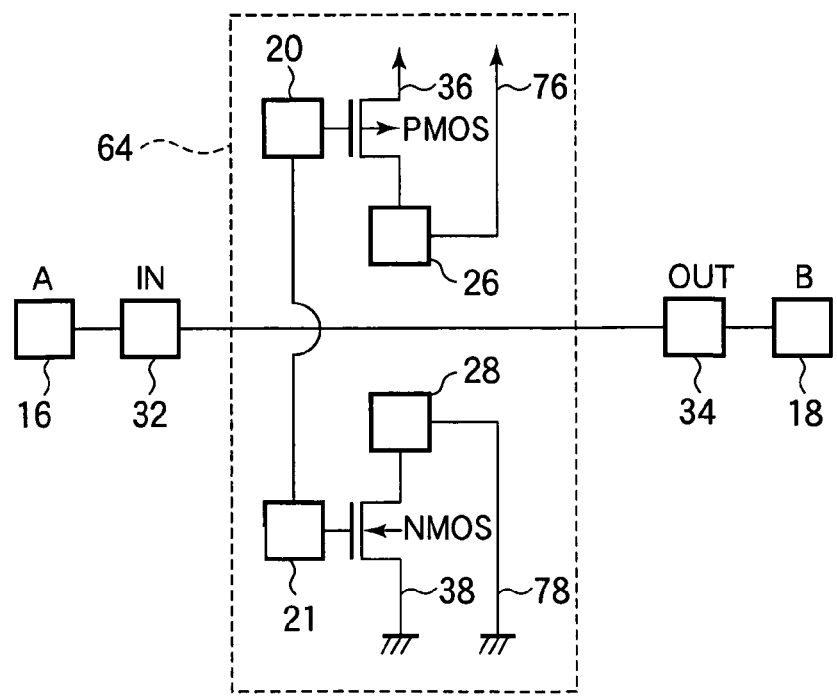
FIG. 5B is a circuit diagram of the layout in FIG. 5A.
Figure 6C:
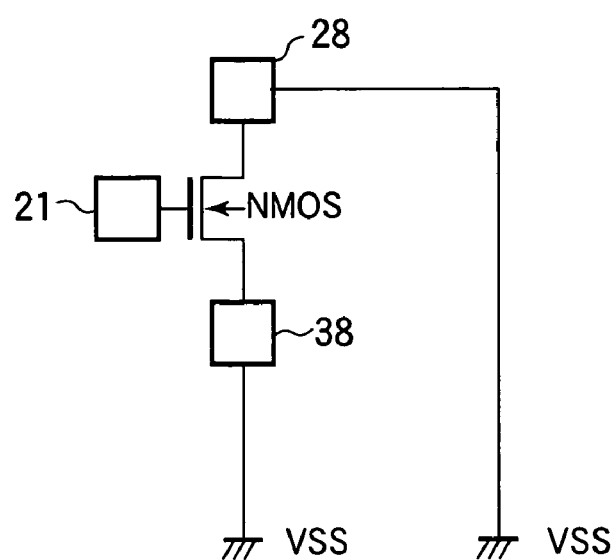
FIG. 6C is a circuit diagram indicating the source and drain capacitance of the transistor in FIG. 6A.

The NMOS circuit is redrawn schematically in FIG. 6C to show the correspondence between the elements in the sectional view in FIG. 6A and the elements in FIGS. 5A and 5B.

As signals traverse the metal signal line 70 from the first functional block A to the second functional block B in FIG. 5A, they are delayed by the capacitive coupling between the signal line 70 and the substrate 100 in FIG. 6A. The capacitive coupling is comparatively weak, however, because the metal signal line pattern 70 is separated from the substrate 100 by the comparatively thick interlayer dielectric film 90, so the signal propagation delay is comparatively slight.

If metal signal line pattern 70 is connected to the gate electrodes 20, 21 as in the third embodiment, however, the capacitive coupling is greatly increased, because of the additional area provided by the gate electrodes 20, 21 and because the gate electrodes 20, 21 are separated from the substrate 100, including the source area 82 and drain area 84, by only a thin dielectric film 88. The signal propagation delay increases accordingly. Disconnecting the gate electrodes 20, 21 from the metal signal line pattern 70 as in the fourth embodiment reduces the signal propagation delay be reducing the capacitive coupling between the metal signal line pattern 70 and the substrate 100.

In the third embodiment, if the drain terminal 28 were not tied to the ground potential VSS, leaving the drain area 84 of the NMOS transistor shown in FIG. 6A floating, then as the signal potential on the metal signal line pattern 70 varied, the strong gate-to-drain capacitive coupling in FIG. 6A would produce corresponding variations in the drain potential of the n-type active region 30. In particular, when the signal on metal signal line pattern 70 was at the high logic level (VDD), the potential of the drain area 84 in FIG. 6A would rise, drawing electrons from the grounded source area 82 into the drain area 84 through the channel formed beneath the gate 86. When the signal on metal signal line pattern 70 returned to the low logic level (VSS) and the gate electrode 21 returned to the ground potential, the drain area 84 would then be brought below the ground potential, allowing electrons to flow from the drain area 84 into the substrate 100.

Effects such as these are known to cause errors in verification tests, so when the tests are carried out, it is necessary to make temporary interconnections that tie down the unconnected terminals of floating transistors. For example, a temporary electrical connection between the drain terminal 28 and metal ground pattern 14 is necessary in the first and second embodiments. The third and fourth embodiments expedite the verification and testing process by removing the need for such temporary interconnections.

In a variation of the fourth embodiment, instead of having conjoined gate electrodes and a common gate terminal 33, the PMOS and NMOS circuits have separate gate electrodes and separate gate terminals, disposed on opposite sides of the metal signal line pattern 70 interconnecting blocks A and B. The gate terminal of the PMOS circuit may then be connected to metal power supply pattern 10 to hold the potential of the PMOS gate electrode at the power supply (VDD) level, and the gate terminal of the NMOS circuit may be connected to metal ground pattern 14 to hold the NMOS gate electrode at the ground (VSS) level. This variation avoids leaving the gate electrodes of the PMOS and NMOS circuits floating. When the interconnections are modified to change the buffer cell to an inverter, the gate terminals are disconnected from metal patterns 10 and 14 and connected to the metal signal line pattern 70 to receive the signal output from functional block A. The drain connections are also modified as described above.

FIFTH EMBODIMENT

A fifth integrated circuit embodying the present invention will be described with reference to the interconnection pattern layout diagram in FIG. 7A and the schematic circuit diagram in FIG. 7B.

The fifth integrated circuit includes a first functional block disposed in a first region, a second functional block disposed in a second region, and two circuits disposed between the first and second regions: a PMOS circuit having a first source terminal, first and second gate terminals, and first and second drain terminals, and an NMOS circuit having a second source terminal, third and fourth gate terminals, and third and fourth drain terminals. The first and third gate terminals are disposed between the source terminals and the first and third drain terminals. The second and fourth gate terminals are disposed between the source terminals and the second and fourth drain terminals. The first source terminal is connected to the first power supply; the second source terminal is connected to the second power supply. The first and third gate terminals are connected to an output terminal of the first functional block. The first and third drain terminals are interconnected to the second and fourth gate terminals. The second and fourth drain terminals are connected to an input terminal of the second functional block.

Figure 7A:
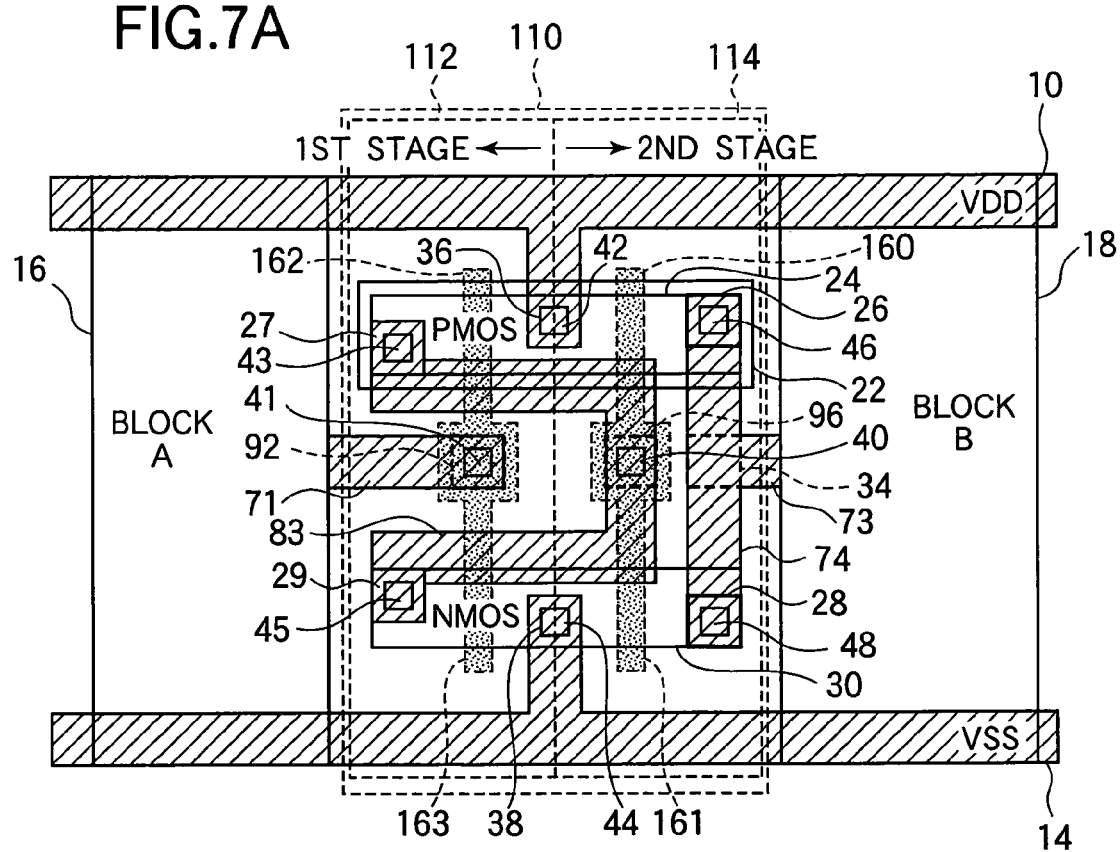
FIG. 7A illustrates the partial layout of a fifth integrated circuit embodying the present invention.

The first and second functional blocks A and B are disposed in respective regions 16, 18 in FIG. 7A, separated by a modification area 110 including the PMOS and NMOS circuits. The modification area 110 is divided into a first-stage modification area 112 and a second-stage modification area 114. The first-stage modification area 112 includes a first-stage inverter cell 118; the second-stage modification area 114 includes a second-stage inverter cell 120. The first and third drain terminals 27, 29 are disposed in the first-stage inverter cell 118 and are connected by a metal pattern 83 to the second and fourth gate electrodes 160, 161 at a point at which the second and fourth gate electrodes 160, 161 are conjoined and connected to a gate terminal 96 in the second-stage inverter cell 120. The first and third gate electrodes 162, 163, which are disposed in the first-stage inverter cell 118, are connected to an input terminal 92, which is connected by a metal signal line pattern 71 to functional block A in the first region 16. The second and fourth drain terminals 26 and 28 are both connected by a metal pattern 74 to the output terminal 34 of the second-stage inverter cell 120, which is connected to functional block B in the second region 18 by a metal signal line pattern 73.

Power supply and ground patterns 10, 14, input and output terminals 92, 34, source terminals 36, 38, drain terminals 26, 27, 28, 29, and metal patterns 71, 73, 74, 83, are disposed in a single metal interconnection layer, with electrical connections to the gate electrodes 160, 161, 162, 163 and active regions 24, 30 through contact holes 40, 41, 42, 43, 44, 45, 46, 48 in an interlayer dielectric film.

The first-stage inverter cell 118 and second-stage inverter cell 120 function as two cascaded inverter stages. The complete logic circuit cell in the modification area 110 is therefore a non-inverting buffer cell.

The second-stage inverter cell 120 can be altered to function as a buffer stage by connecting the gate terminal 96 in the second-stage inverter cell 120 to the output terminal 34 by a new metal interconnecting line, and disconnecting the drain terminals 26, 28 of the PMOS and NMOS circuits in the second-stage inverter cell 120 from the output terminal 34 by eliminating corresponding parts of metal pattern 74, without changing the fixed layout of the input terminal 92, the output terminal 34, the gate terminal 96, the PMOS circuit, and the NMOS circuit. With this modification, the complete logic circuit cell in the modification area 110 functions as an inverter cell.

This modification can be made by the alteration of the single photolithography mask that defines the layer of metal interconnecting lines including metal pattern 74. The modification is limited to the second-stage modification area 114, more specifically to the area (in which metal pattern 74 is disposed) between the drain terminal 26 of the PMOS circuit and the drain terminal 28 of the NMOS circuit in the second-stage inverter cell 120, and the area between the gate terminal 96 and the output terminal 34. This simple modification can be made without changing the existing layout of the first and second functional blocks A and B. The entire modification can be completed in two redesign steps: in the first step, the third and fourth drain terminals 26, 28 are disconnected from the output terminal 34, without changing any other interconnections; in the second step, the gate terminal 96 (and thus the first and third drain terminals 27, 29) IS interconnected to the output terminal 34, which is the input terminal of the second functional block B, again without changing any other interconnections.

SIXTH EMBODIMENT

A sixth integrated circuit embodying the present invention will be described with reference to the interconnection pattern layout diagram in FIG. 8A and the schematic circuit diagram in FIG. 8B.

The sixth integrated circuit includes a first functional block located in a first region, a second functional block located in a second region, and two circuits disposed between the first and second regions: a PMOS circuit having a first source terminal, first and second gate terminals, and first and second drain terminals, and an NMOS circuit having a second source terminal, third and fourth gate terminals, and third and fourth drain terminals. The first and third gate terminals are disposed between the source terminals and the first and third drain terminals. The second and fourth gate terminals are disposed between the source terminals and the second and fourth drain terminals. The first source terminal is connected to the first power supply; the second source terminal is connected to the second power supply. The first and third gate terminals are connected to an output terminal of the first functional block. The first and third drain terminals are interconnected to the second and fourth gate terminals, and to an input terminal of the second functional block.

Figure 8A:
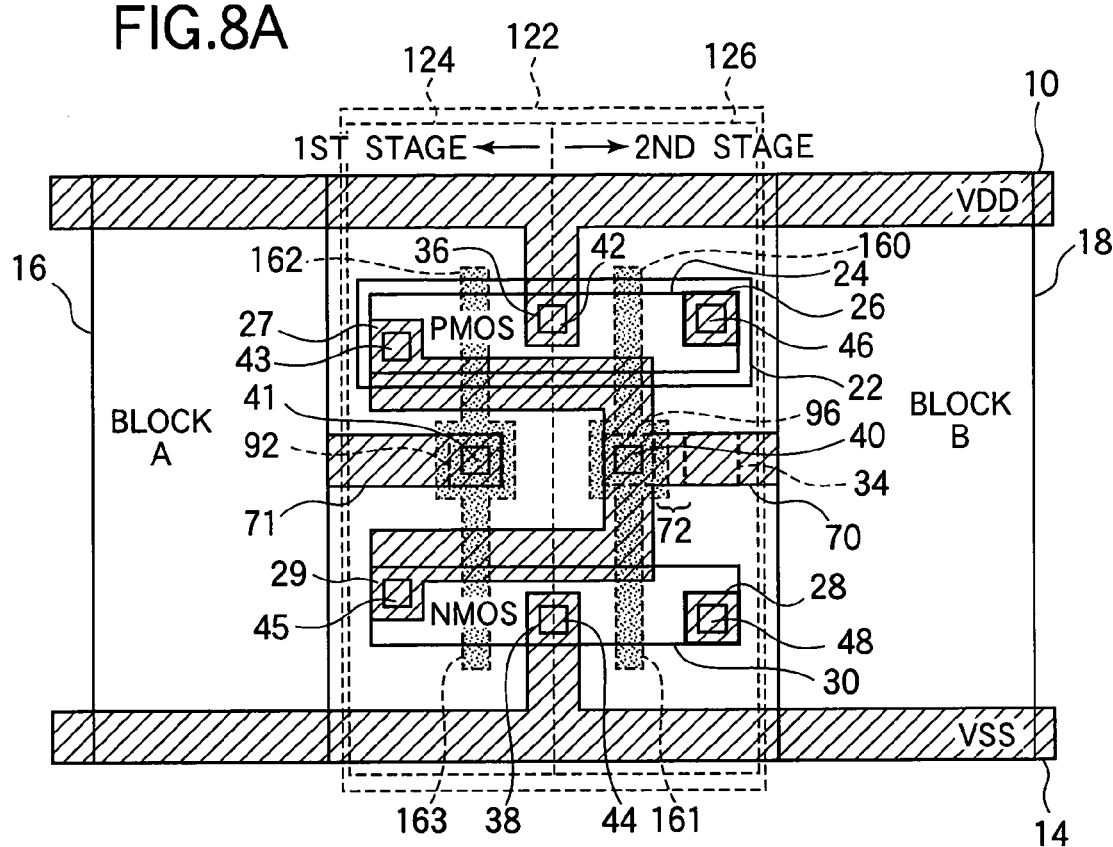
FIG. 8A illustrates the partial layout of a sixth integrated circuit embodying the present invention.
Figure 8B:
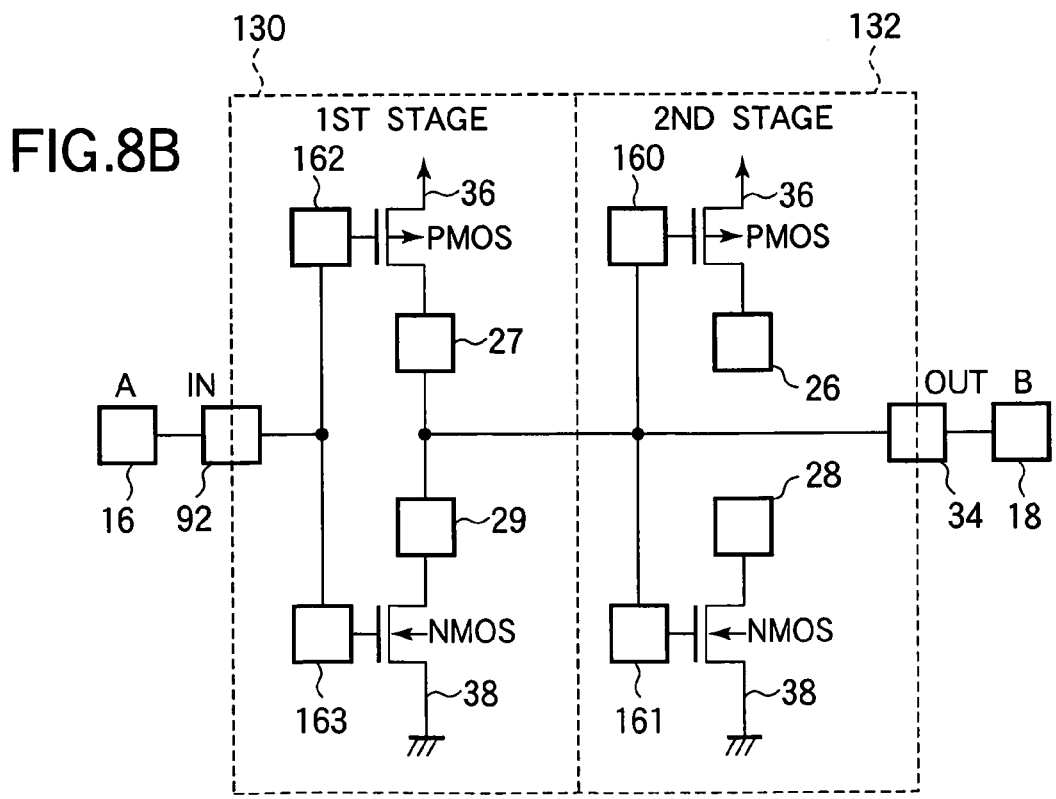
FIG. 8B is a circuit diagram of the layout in FIG. 8A.

The first and second functional blocks A and B are disposed in respective regions 16, 18 in FIG. 8A, separated by a modification area 122 including the PMOS and NMOS circuits. The modification area 122 is divided into a first-stage modification area 124 and a second-stage modification area 126. The first-stage modification area 124 includes a first-stage inverter cell 130; the second-stage modification area 126 includes a second-stage buffer cell 132. The first and third gate electrodes 162, 163 which are disposed in the first-stage inverter cell 130, are connected to an input terminal 92, which is connected by a metal signal line pattern 71 to functional block A in the first region 16. The first and third drain terminals 27, 29, also disposed in the first-stage inverter cell 118, are connected by a metal signal line pattern 70 to the second and fourth gate electrodes 160, 161 an output terminal 34, and an input terminal of functional block B in the second region 18.

The power supply and ground patterns 10, 14, input and output terminals 92, 34, source terminals 36, 38, drain terminals 26, 27, 28, 29, and metal patterns 70, 71 are disposed in a single metal interconnection layer, with electrical connections to the gate electrodes 160, 161, 162, 163 and active regions 24, 30 formed through contact holes 40, 41, 42, 43, 44, 45, 46, 48 in an interlayer dielectric film.

The first-stage inverter cell 130 and second-stage buffer cell 132 combine to function as an inverter. The complete logic circuit cell in the modification area 110 is therefore an inverter cell.

Only one metal signal line pattern 70 is disposed in and crosses the space between the drain terminals 26 and 28 of the PMOS and NMOS circuits in the second-stage buffer cell 132, so the output terminal 34 could be easily disconnected from the gate terminal 96 in the second-stage buffer cell 132 and connected to the second and fourth drain terminals 26 and 28 by altering the metal interconnection layer including metal signal line patterns 70 and 71. Thus modified, the second-stage buffer cell 132 in the second-stage modification area 126 functions as an inverter stage, and the sixth integrated circuit becomes identical to the unmodified form of the fifth integrated circuit shown in FIGS. 7A and 7B.

The above modification can be made by the alteration of the single photolithography mask that defines the layer of metal interconnecting lines including metal signal line patterns 70 and 71. The modification is limited to the second-stage modification area 126, more specifically to the area between the drain terminal 26 of the PMOS circuit and the drain terminal 28 of the NMOS circuit in the second-stage buffer cell 132, and the area between the gate terminal 96 and the output terminal 34. This simple modification can be made without changing the existing layout of the first functional block A and the second functional block B.

SEVENTH EMBODIMENT

A seventh integrated circuit embodying the present invention will be described with reference to the interconnection pattern layout diagram in FIG. 9A and the schematic circuit diagram in FIG. 9B.

Like the fifth and sixth integrated circuits, the seventh integrated circuit includes a first functional block disposed in a first region, a second functional block disposed in a second region, and two circuits disposed between the first and second regions: a PMOS circuit having a first source terminal, first and second gate terminals, and first and second drain terminals, and an NMOS circuit having a second source terminal, third and fourth gate terminals, and third and fourth drain terminals. The first and third gate terminals are disposed between the source terminals and the first and third drain terminals. The second and fourth gate terminals are disposed between the source terminals and the second and fourth drain terminals. The first source terminal and second drain terminal are connected to the first power supply; the second source terminal and fourth drain terminal are connected to the second power supply. The first and third gate terminals are connected to an output terminal of the first functional block. The first and third drain terminals are interconnected to the second and fourth gate terminals, and to an input terminal of the second functional block.

Figure 9A:
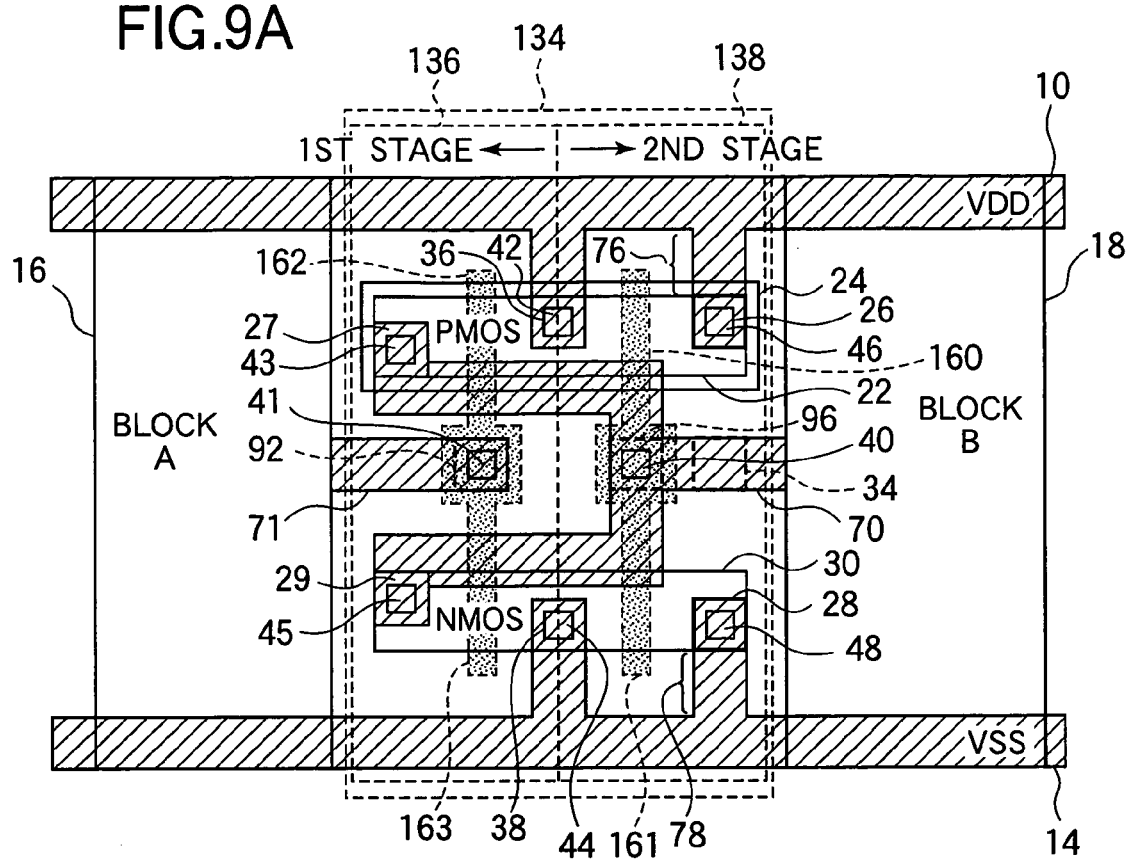
FIG. 9A illustrates the partial layout of a seventh integrated circuit embodying the present invention.
Figure 9B:
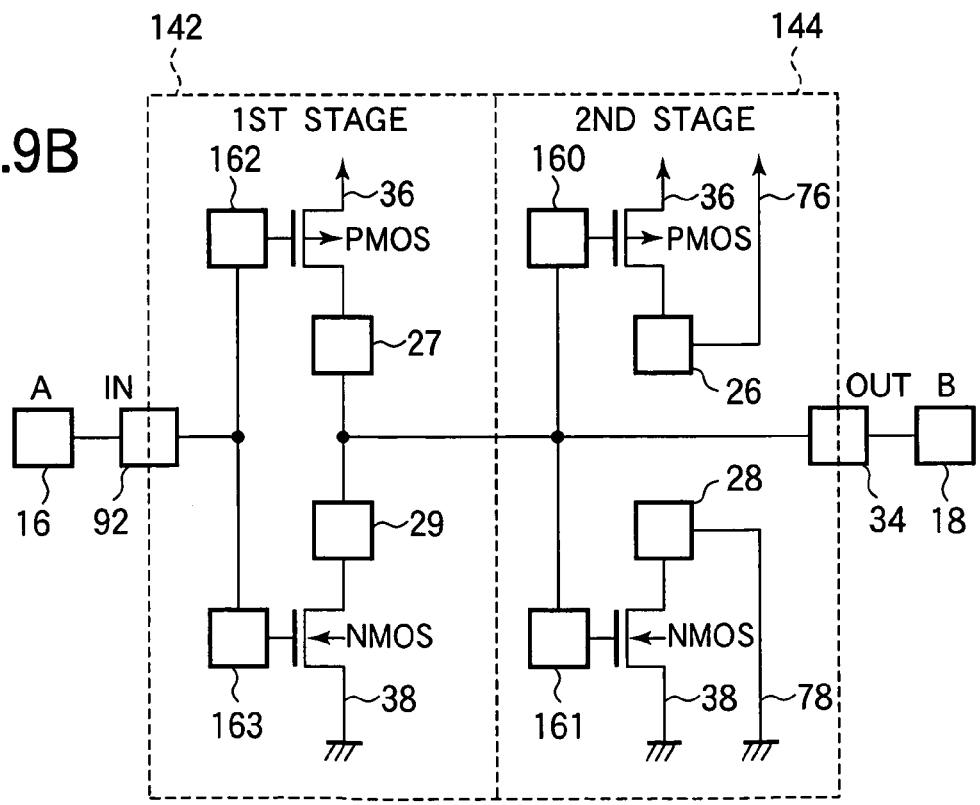
FIG. 9B is a circuit diagram of the layout in FIG. 9A.

The first and second functional blocks A and B are disposed in respective regions 16, 18 in FIG. 9A, separated by a modification area 134 including the PMOS and NMOS circuits. The modification area 134 is divided into a first-stage modification area 136 and a second-stage modification area 138. The first-stage modification area 136 includes a first-stage inverter cell 142; the second-stage modification area 138 includes a second-stage buffer cell 144. The first and third gate electrodes 162, 163, which are disposed in the first-stage inverter cell 142, are connected to an input terminal 92, which is connected by a metal signal line pattern to functional block A in the first region 16. The first and third drain terminals 27, 29, also disposed in the first-stage inverter cell 118, are connected by a metal pattern 70 to the second and fourth gate electrodes 160, 161, an output terminal 34, and an input terminal of functional block B in the second region 18. Additional metal patterns 76, 78 connect the drain terminals 26, 28 of the PMOS and NMOS circuits in the second-stage buffer cell 144 to the metal power supply pattern 10 and metal ground pattern 14.

Power supply and ground patterns 10, 14, input and output terminals 92, 34, source terminals 36, 38, drain terminals 26, 27, 28, 29, metal patterns 70, 76, 78, and the metal signal line pattern 71 connecting the input terminal 92 to functional block A are disposed in a single metal interconnection layer, with electrical connections to the gate electrodes 160, 161, 162, 163 and active regions 24, 30 formed through contact holes 40, 41, 42, 43, 44, 45, 46, 48 in an interlayer dielectric film.

The first-stage inverter cell 142 and second-stage buffer cell 144 combine to function as an inverter. The complete logic circuit cell in the modification area 110 is therefore an inverter cell.

The second-stage buffer cell 144 can be altered to function as an inverter stage by connecting the drain terminals 26, 28 of the PMOS and NMOS circuits in the second-stage buffer cell 144 to the output terminal 34 by a new metal interconnecting line, disconnecting the gate terminal 96 in the second-stage buffer cell 144 from the output terminal 34, and eliminating metal patterns 76 and 78, without changing the fixed layout of the output terminal 34, the PMOS circuit, and the NMOS circuit in the second-stage buffer cell 144.

The seventh integrated circuit can be modified as described above by alteration of the single photolithography mask that defines the layer of metal interconnecting lines including metal patterns 70, 76, and 78. The modification is limited to the second-stage modification area 138, more specifically to the area between the drain terminal 26 of the PMOS circuit and the drain terminal 28 of the NMOS circuit in the second-stage buffer cell 144, the area between the conjoined gate terminal 96 and the output terminal 34 of the second-stage buffer cell 144, the area between the drain terminal 26 and metal power supply pattern 10, and the area between the drain terminal 28 and metal ground pattern 14. This simple modification can be made without changing the existing layout of the first and second functional blocks A and B.

Differing from the sixth integrated circuit, power is supplied at the power supply potential (VDD) to the drain terminal 26 of the PMOS circuit from metal power supply pattern 10 by metal pattern 76, and at the ground potential (VSS) to the drain terminal 28 of the NMOS circuit from metal ground pattern 14 by metal pattern 78. Accordingly, although in the sixth integrated circuit there is space to route another metal line between the second-stage drain terminal 26 of the PMOS circuit and metal power supply pattern 10, and between the second-stage drain terminal 28 of the NMOS circuit and metal ground pattern 14, this cannot be done in the seventh integrated circuit. As in the third and fourth integrated circuits, however, the PMOS and NMOS circuits are not left electrically floating.

EIGHTH EMBODIMENT

An eighth integrated circuit embodying the present invention will be described with reference to the interconnection pattern layout diagram in FIG. 10A and the schematic circuit diagram in FIG. 10B.

Like the fifth, sixth, and seventh integrated circuits, the eighth integrated circuit includes a first functional block disposed in a first region, a second functional block disposed in a second region, and two circuits disposed between the first and second regions: a PMOS circuit having a first source terminal, first and second gate terminals, and first and second drain terminals, and an NMOS circuit having a second source terminal, third and fourth gate terminals, and third and fourth drain terminals. The first and third gate terminals are disposed between the source terminals and the first and third drain terminals. The second and fourth gate terminals are disposed between the source terminals and the second and fourth drain terminals. The first source terminal and second drain terminal are connected to the first power supply; the second source terminal and fourth drain terminal are connected to the second power supply. The first and third gate terminals are connected to an output terminal of the first functional block. The first and third drain terminals are interconnected to the second and fourth gate terminals, and to an input terminal of the second functional block.

Figure 10A:
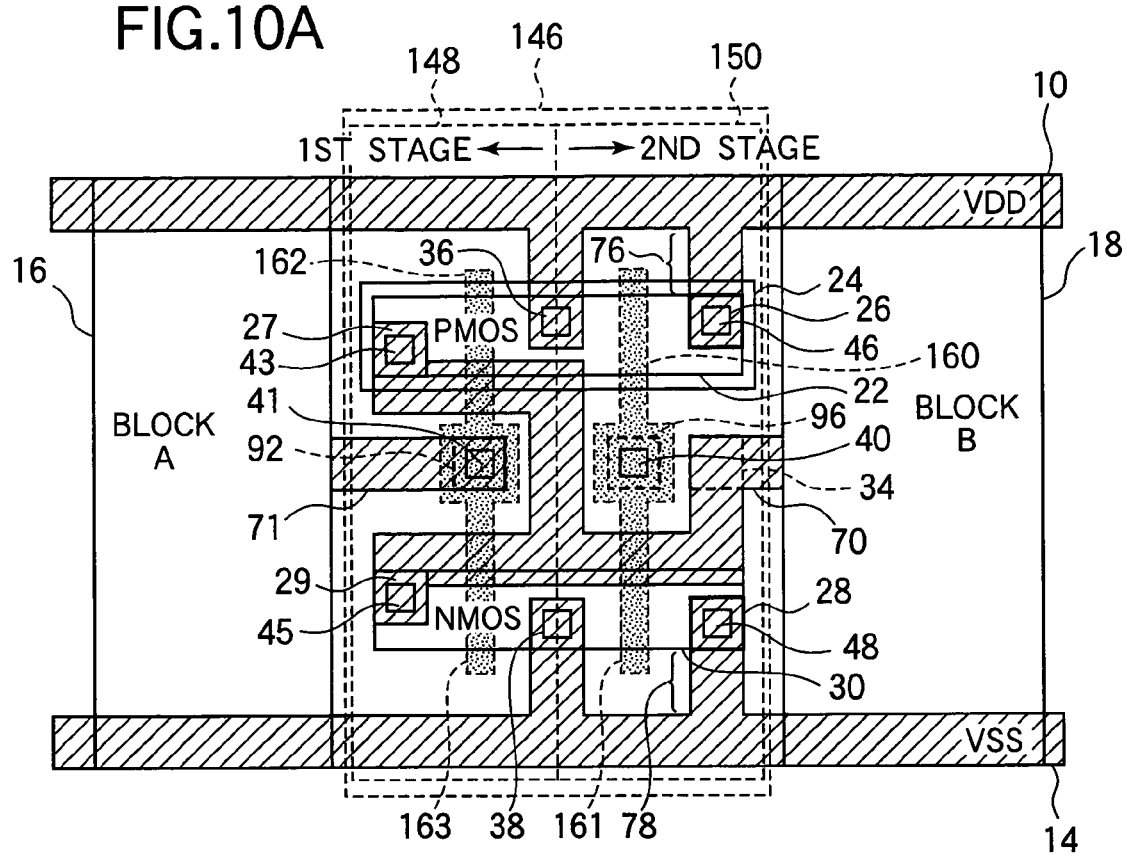
FIG. 10A illustrates the partial layout of an eighth integrated circuit embodying the present invention.
Figure 10B:
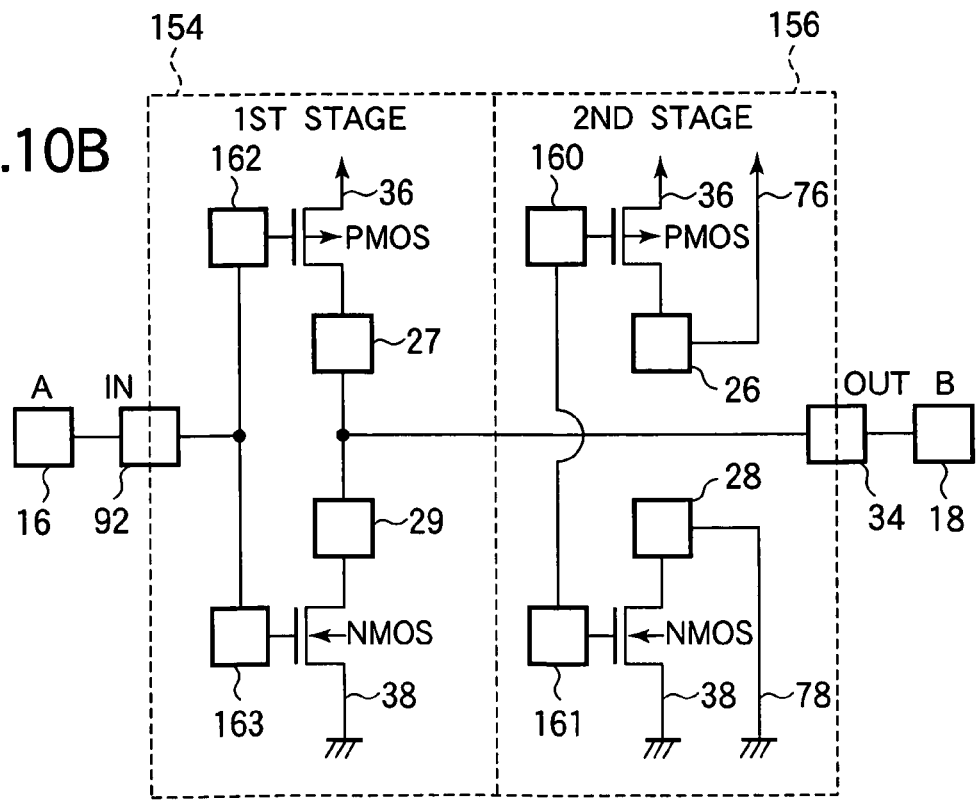
FIG. 10B is a circuit diagram of the layout in FIG. 10A.

The first and second functional blocks A and B are disposed in respective regions 16, 18 in FIG. 10A, separated by a modification area 146 including the PMOS and NMOS circuits. The modification area 146 is divided into a first-stage modification area 148 and a second-stage modification area 150. The first-stage modification area 148 includes a first-stage inverter cell 154; the second-stage modification area 150 includes a second-stage buffer cell 156. The first and third gate electrodes 162, 163, which are disposed in the first-stage inverter cell 154, are connected to an input terminal 92, which is connected by a metal signal line pattern 71 to functional block A in the first region 16. The first and third drain terminals 27, 29, also disposed in the first-stage inverter cell 118, are connected by a metal pattern 70 to the second and fourth gate electrodes 160, 161, an output terminal 34, and an input terminal of functional block B in the second region 18. The second and fourth drain terminals 26, 28, disposed in the second-stage buffer cell 156, are connected by metal patterns 76, 78 to the metal power supply pattern 10 and the metal ground pattern 14.

Power supply and ground patterns 10, 14, input and output terminals 92, 34, source terminals 36, 38, drain terminals 26, 27, 28, 29, metal patterns 70, 71, 76, 78, and the metal pattern connecting the input terminal 92 to functional block A are disposed in a single metal interconnection layer, with electrical connections to the gate electrodes 160, 161, 162, 163 and active regions 24, 30 formed through contact holes 40, 41, 42, 43, 44, 45, 46, 48 in an interlayer dielectric film.

The first-stage inverter cell 154 and second-stage buffer cell 156 combine to function as an inverter. The complete logic circuit cell in the modification area 110 is therefore an inverter cell.

Figure 7B:
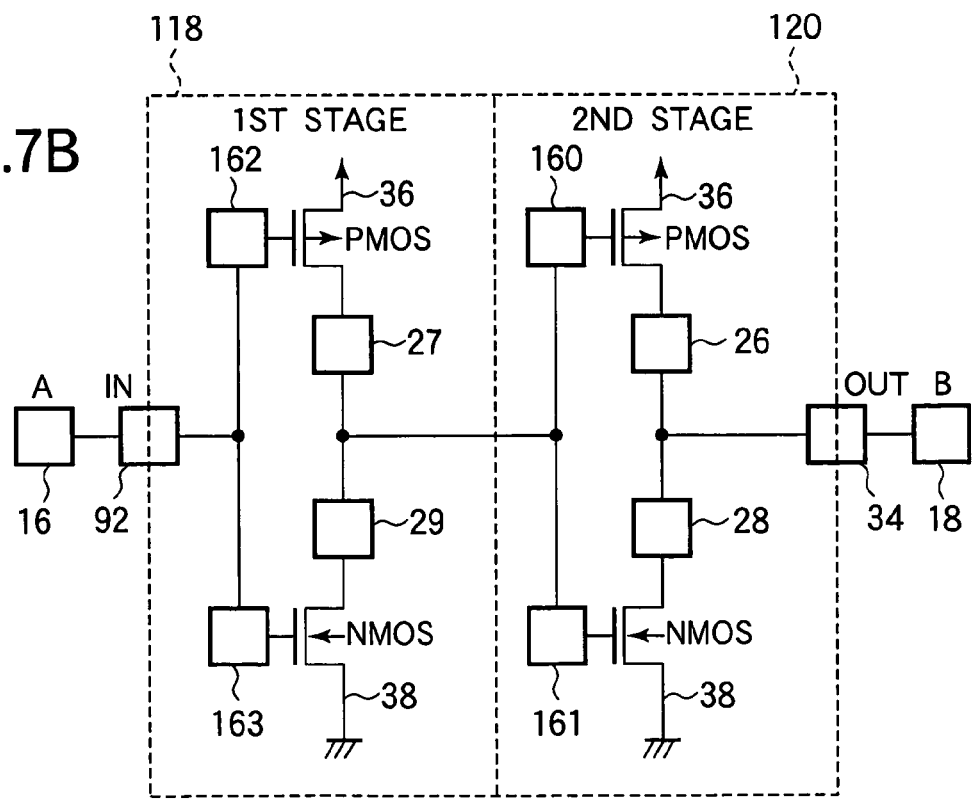
FIG. 7B is a circuit diagram of the layout in FIG. 7A.

The second-stage buffer cell 156 can be altered to function as a second inverter stage by altering metal signal line pattern 70 to connect the drain terminals 27 and 29 of the PMOS and NMOS circuits in the first-stage inverter cell 154 to the gate terminal 96 in the second-stage buffer cell 156 instead of to the output terminal 34, connecting the drain terminal 26 of the PMOS circuit in the second-stage buffer cell 156 and the drain terminal 28 of the NMOS circuit in the second-stage buffer cell 156 to the output terminal 34 by a new metal interconnecting line, and eliminating metal patterns 76 and 78, as shown in FIGS. 7A and 7B, without changing the fixed layout of the output terminal 34, the input terminal 92 of the first-stage inverter cell 154, the PMOS circuit, and the NMOS circuit in the second-stage buffer cell 156.

The eighth integrated circuit can be modified as described above by alteration of the single photolithography mask that defines the layer of metal interconnecting lines including metal patterns 70, 76, and 78. The modification is limited to the second-stage modification area 150, more specifically to the area between the drain terminals 26, 28 of the PMOS and NMOS circuits in the second-stage buffer cell 156, the area around the gate terminal 96, the area between the drain terminal 26 and metal power supply pattern 10, and the area between the drain terminal 28 and metal ground pattern 14. This simple modification can be made without changing the existing layout of the first and second functional blocks A and B.

Differing from the seventh integrated circuit, the drain terminals 27 and 29 of the first-stage inverter cell 154 are disconnected from the gate terminal 96 in the second-stage buffer cell 156. The signal propagation speed between the input terminal 92 and output terminal 34 is therefore substantially increased, because signals are not slowed by the gate capacitance of the PMOS and NMOS circuits 22, 30.

The two-stage logic cells in the fifth to eighth embodiments are functionally equivalent to the singe-stage logic cells in the first to fourth embodiments. Changing the second stage from a buffer cell to an inverter cell, or from an inverter cell to a buffer cell, changes the logic of the two-stage cell as a whole from inverting to non-inverting, or from non-inverting to inverting, in the same way as changing the single-stage cells in the first to fourth embodiments from an inverter to a buffer, or from a buffer to an inverter. The two-stage cells in the fifth to eighth embodiments also have the same basic structure as the single-stage cells in the first to fourth embodiments. The same design data can therefore be used for computer-aided design of integrated circuits, regardless of whether single-stage cells or two-stage cells are used to enable the signal logic to be reversed between functional blocks.

The need for the two-stage cell structure in the fifth to eighth embodiments arises when, for example, distortion occurs in the waveform of the signal as it propagates from the first functional block to the second functional block, making it necessary to reshape the waveform by having the signal pass through at least one inverter stage. Reshaping a signal waveform by passing the signal through a cascaded plurality of inverter stages is a well-known and widely practiced circuit design technique. A significant advantage of the present invention is that when an integrated circuit is designed using a computer-assisted design system, much of the same design data that is already used for waveshaping purposes can also be used to provide means for easily modifying signal logic, thereby simplifying the design work and reducing the circuit fabrication cost.

In a variation of the eighth embodiment, instead of sharing a conjoined gate electrodes 160, 161 and a shared gate terminal 96, the second stages of the PMOS and NMOS circuits have separate gate electrodes and separate gate terminals, disposed on opposite sides of metal signal line pattern 70. The gate terminal of the second-stage PMOS circuit may then be connected to the metal power supply pattern 10 to hold the potential of gate electrode 160 at the power supply (VDD) level, and the gate terminal of the second-stage NMOS circuit may be connected to the metal ground pattern 14 to hold the potential of gate electrode 161 at the ground (VSS) level. This variation avoids leaving any floating gate electrodes. When the interconnections are modified to change the inverter cell to a buffer, the gate terminals of the second-stage PMOS and NMOS circuits are disconnected from metal patterns 10 and 14 and connected to metal signal line pattern 70 to receive the drain signal output from first stage. The drain connections are also modified as described above.

The preceding embodiments have illustrated several ways in which the present invention may be practiced, but those skilled in the art will recognize that further variations are possible within the scope of the invention, which is defined in the appended claims.

What is claimed is:

1. A method of redesigning a semiconductor integrated circuit, which includes a first functional block, a second functional block, a metal interconnection layer, and a signal line disposed in the metal interconnection layer for transmitting a signal from the first functional block to the second functional block and which is fabricated with the aid of a predetermined mask defining the metal interconnection layer, to invert the signal carried on the signal line, said method comprising:

providing a p-channel metal-oxide-semiconductor (PMOS) circuit disposed between the first functional block and the second functional block, the PMOS circuit having a source terminal, a gate terminal, and a drain terminal, the drain terminal extending to said metal interconnection layer at a point separated by a first space from said signal line, and the gate terminal also extending to said metal interconnection layer;

providing an n-channel metal-oxide-semiconductor (NMOS) circuit disposed between the first functional block and the second functional block, the NMOS circuit having a source terminal, a gate terminal, and a drain terminal, the drain terminal extending to said metal interconnection layer at a point separated by a second space from said signal line, and the gate terminal also extending to said metal interconnection layer;

modifying the predetermined mask so as to cause an intermediate part of the signal line to be removed, thereby dividing the signal line into a first part receiving the signal from the first functional block and a second part transmitting the signal to the second functional block; and modifying the mask so as to cause the drain terminals of the PMOS circuit and the NMOS circuit to be connected to the second part of the signal line.

2. A method of redesigning a semiconductor integrated circuit, which includes a first functional block, a second functional block, a metal interconnection layer, a signal line disposed in the metal interconnection layer for transmitting a signal from the first functional block to the second functional block, a power supply pattern disposed in the metal interconnection layer, and a ground pattern disposed in the metal interconnection layer and which is fabricated with the aid of a predetermined mask defining the metal interconnection layer, to invert the signal carried on the signal line, said method comprising:

providing a p-channel metal-oxide-semiconductor (PMOS) circuit disposed between the first functional block and the second functional block, the PMOS circuit having a source terminal, a gate terminal, and a drain terminal, the drain terminal extending to said metal interconnection layer at a point separated by a first space from said signal line, and the gate terminal also extending to said metal interconnection layer, wherein conductors in the metal interconnection layer connect the source and drain terminals of the PMOS circuit to the power supply pattern;

providing an n-channel metal-oxide-semiconductor (NMOS) circuit disposed between the first functional block and the second functional block, the NMOS circuit having a source terminal that is connected to the ground pattern, a gate terminal, and a drain terminal, the drain terminal extending to said metal interconnection layer at a point separated by a second space from said signal line, and the gate terminal also extending to said metal interconnection layer, wherein conductors in the metal interconnection layer connect the source and drain terminals of the NMOS circuit to the ground pattern;

modifying the predetermined mask so as to cause an intermediate part of the signal line to be removed, thereby dividing the signal line into a first part receiving the signal from the first functional block and a second part transmitting the signal to the second functional block;

modifying the predetermined mask so as to cause the drain terminal of the PMOS circuit to be disconnected from the power supply pattern;

modifying the predetermined mask so as to cause the drain terminal of the NMOS circuit to be disconnected from the ground pattern; and modifying the predetermined mask so as to cause the drain terminals of the PMOS circuit and the NMOS circuit to be connected to the second part of the signal line.

3. A method of redesigning a semiconductor integrated circuit, which includes a first functional block, a second functional block, a metal interconnection layer, and a signal line disposed in the metal interconnection layer for transmitting a signal from the first functional block to the second functional block and which is fabricated with the aid of a predetermined mask defining the metal interconnection layer, to invert the signal carried on the signal line, said method comprising:

providing a p-channel metal-oxide-semiconductor (PMOS) circuit disposed between the first functional block and the second functional block, the PMOS circuit having a source terminal, a gate terminal, and a drain terminal, the drain terminal extending to said metal interconnection layer at a point separated by a first space from said signal line, and the gate terminal also extending to said metal interconnection layer, wherein the gate terminal of the PMOS circuit is not connected to the signal line in the metal interconnection layer;

providing an n-channel metal-oxide-semiconductor (NMOS) circuit disposed between the first functional block and the second functional block, the NMOS circuit having a source terminal, a gate terminal, and a drain terminal, the drain terminal extending to said metal interconnection layer at a point separated by a second space from said signal line, and the gate terminal also extending to said metal interconnection layer, wherein the gate terminal of the NMOS circuit is not connected to the signal line in the metal interconnection layer;

modifying the predetermined mask so as to cause an intermediate part of the signal line to be removed, thereby dividing the signal line into a first part receiving the signal from the first functional block and a second part transmitting the signal to the second functional block;

modifying the predetermined mask so as to cause the gate terminals of the PMOS circuit and the NMOS circuit to be connected to the first part of the signal line; and modifying the predetermined mask so as to cause the drain terminals of the PMOS circuit and the NMOS circuit to be connected to the second part of the signal line.

4. A method of redesigning a semiconductor integrated circuit, which includes a first functional block, a second functional block, a metal interconnection layer, and an inverter cell disposed between the first functional block and the second functional block for transmitting a signal from the first functional block to the second functional block and which is fabricated with the aid of a predetermined mask, to convert the inverter cell to a buffer cell, wherein the inverter cell includes a PMOS circuit having a first source terminal, a first drain terminal, a first gate terminal disposed between the first source terminal and the first drain terminal, a second drain terminal, and a second gate terminal disposed between the first source terminal and the second drain terminal, the first and second drain terminals and the first and second gate terminals extending to said metal interconnection layer; wherein the inverter cell also includes an NMOS circuit having a second source terminal, a third drain terminal, a third gate terminal disposed between the second source terminal and the third drain terminal, a fourth drain terminal, and a fourth gate terminal disposed between the second source terminal and the fourth drain terminal, the third and fourth drain terminals and the third and fourth gate terminals extending to said metal interconnection layer; wherein the inverter cell additionally includes a first metal pattern disposed in said metal interconnection layer, connected to the first functional block and the first and third gate terminals, for transmitting an output signal from the first functional block to the first and third gate terminals; wherein the inverter cell further includes a second metal pattern disposed in said metal interconnection layer, connected to the first and third drain terminals and the second functional block, for transmitting an inverted output signal from the first and third drain terminals to the second functional block, the second metal pattern being separated by a first space from the second drain terminal and by a second space from the fourth drain terminal, the first space and the second space being devoid of metal signal lines in said metal interconnection layer, and wherein the method comprises:

modifying the predetermined mask so as to cause an intermediate part of the second metal pattern to be removed, thereby dividing the second metal pattern into a first part connected to the first and third drain terminals and a second part connected to the second functional block; and modifying the predetermined mask so as to cause the second and fourth drain terminals to be connected to the second part of the second part of the metal pattern.

5. A method of redesigning a semiconductor integrated circuit, which includes a first functional block, a second functional block, a metal interconnection layer, a power supply pattern disposed in the metal interconnection layer, a ground pattern disposed in the metal interconnection layer, and an inverter cell disposed between the first functional block and the second functional block for transmitting a signal from the first functional block to the second functional block and which is fabricated with the aid of a predetermined mask, to invert the signal carried on the signal line, wherein the inverter cell includes a PMOS circuit having a first source terminal that is connected to the power supply pattern, a first drain terminal, a first gate terminal disposed between the first source terminal and the first drain terminal, a second drain terminal that is connected to the power supply pattern, and a second gate terminal disposed between the first source terminal and the second drain terminal, the first and second drain terminals and the first and second gate terminals extending to said metal interconnection layer; wherein the inverter cell also includes an NMOS circuit having a second source terminal that is connected to the ground pattern, a third drain terminal, a second gate terminal disposed between the second source terminal and the third drain terminal, a fourth drain terminal that is connected to the ground pattern, and a fourth gate terminal disposed between the third source terminal arid the fourth drain terminal, the third and fourth drain terminals and the third and fourth gate terminals extending to said metal interconnection layer; wherein the inverter cell additionally includes a first metal pattern disposed in said metal interconnection layer, connected to the first functional block and the first and third gate terminals, for transmitting an output signal from the first functional block to the first and third gate terminals; wherein the inverter cell further includes a second metal pattern disposed in said metal interconnection layer, connected to the first and third drain terminals and the second functional block, for transmitting an inverted output signal from the first and third drain terminals to the second functional block, the second metal pattern being separated by a first space from the second drain terminal and by a second space from the fourth drain terminal, the first space and the second space being devoid of meal signal lines in said metal interconnection layer, and wherein the method comprises:

modifying the predetermined mask so as to cause an intermediate part of the second metal pattern to be removed, thereby dividing the second metal pattern into a first part connected to the first and third drain terminals and a second part connected to the second functional block;

modifying the predetermined mask so as to cause the second drain terminal to be disconnected from the power supply pattern;

modifying the predetermined mask so as to cause the fourth drain terminal to be disconnected from the ground pattern; and modifying the predetermined mask so as to cause the second and fourth drain terminals to be connected to the second part of the second metal pattern.

6. A method of redesigning a semiconductor integrated circuit, which includes a first functional block, a second functional block, a metal interconnection layer, a power supply pattern disposed in the metal interconnection layer, a ground pattern disposed in the metal interconnection layer, and an inverter cell disposed between the first functional block and the second functional block for transmitting a signal from the first functional block to the second functional block and which is fabricated with the aid of a predetermined mask, to invert the signal carried on the signal line, wherein the inverter cell includes a PMOS circuit having a first source terminal, a first drain terminal that is connected to the power supply pattern, a first gate terminal disposed between the first source terminal and the first drain terminal, a second drain terminal, and a second gate terminal disposed between the first source terminal and the second drain terminal, the first and second drain terminals and the first and second gate terminals extending to said metal interconnection layer; wherein the inverter cell also includes an NMOS circuit having a second source terminal that is connected to the ground pattern, a third drain terminal, a third gate terminal disposed between the second source terminal and the third drain terminal, a fourth drain terminal, and a fourth gate terminal disposed between the third source terminal and the fourth drain terminal, the third and fourth drain terminals and the third and fourth gate terminals extending to said metal interconnection layer; wherein the inverter cell additionally includes a first metal pattern disposed in said metal interconnection layer, connected to the first functional block and the first and third gate terminals, for transmitting an output signal from the first functional block to the first and third gate terminals; wherein the inverter cell, further includes a second metal pattern disposed in said metal interconnection layer, connected to the first and third drain terminals, the second and fourth gate terminals, and the second functional block, for transmitting an inverted output signal from the first and third drain terminals to the second functional block, the second metal pattern being separated by a first space from the second drain terminal and by a second space from the fourth drain terminal, the first space and the second space being devoid of metal signal lines in said metal interconnection layer, and wherein the method comprises:

modifying the predetermined mask so as to cause an intermediate part of the second metal pattern to be removed, thereby dividing the second metal pattern into a first part connected to the first and third drain terminals and a second part connected to the second functional block;

modifying the predetermined mask so as to cause the second and fourth gate terminals to be connected to the first part of the second metal pattern; and modifying the predetermined mask so as to cause the second and fourth drain terminals to be connected to the second part of the second metal pattern.

7. A method of redesigning a semiconductor integrated circuit which includes a first functional block, a second functional block, a metal interconnection layer, and an inverter cell disposed between the first functional block and the second functional block and which is fabricated with the aid of a predetermined mask defining the metal interconnection layer, wherein the inverter cell includes a PMOS circuit having a first source terminal, a first drain terminal, and a first gate terminal disposed between the first source terminal and the first drain terminal, the first drain terminal and the first gate terminal extending to said metal interconnection layer, and an NMOS circuit having a second source terminal, a second drain terminal, and a second gate terminal disposed between the second source terminal and the second drain terminal, the second drain terminal and the second gate terminal extending to said metal interconnection layer, a first metal pattern disposed in said metal interconnection layer, connected to the first functional block and the first and second gate terminals, for transmitting an output signal from the first functional block to the first and second gate terminals, and a second metal pattern disposed in said metal interconnection layer, connected to the first and second drain terminals and the second functional block, for transmitting an inverted output signal from the first and second drain terminals to the second functional block, and wherein the method comprises:

modifying the predetermined mask so as to cause the first and second drain terminals to be disconnected from the second metal pattern; and modifying the mask so as to cause the first and second metal patterns to be mutually interconnected.

8. The method of claim 7, wherein said metal interconnection layer includes a power supply pattern connected to the first source terminal and a ground pattern connected to the second source terminal, and further comprising:

modifying the predetermined mask so as to cause the first drain terminal to be connected to the power supply pattern; and modifying the predetermined mask so as to cause the second drain terminal to be connected to the ground pattern.

9. The method of claim 7, further comprising modifying the predetermined mask so as to cause the first and second gate terminals to be disconnected from the first metal pattern.

10. The method of claim 7, wherein the first inverter cell is cascaded with a second inverter cell disposed between the first inverter cell and the first functional block.

11. A method of designing and redesigning a semiconductor integrated circuit which includes a first functional block, a second functional block, a metal interconnection layer, and a signal line disposed in the metal interconnection layer for transmitting a signal from the first functional block to the second functional block, and which is fabricated with the aid of a mask defining the metal interconnection layer, the method comprising:

providing a p-channel metal-oxide-semiconductor (PMOS) circuit disposed between the first functional block and the second functional block, the PMOS circuit having a first source terminal, a first gate terminal, and a first drain terminal, the first drain terminal extending to said metal interconnection layer at a point separated by a first space from said signal line, the first gate terminal also extending to said metal interconnection layer;

providing an n-channel metal-oxide-semiconductor (NMOS) circuit disposed between the first functional block and the second functional block, the NMOS circuit having a second source terminal, a second gate terminal, and a second drain terminal, the second drain terminal extending to said metal interconnection layer at a point separated by a second space from said signal line, the second gate terminal also extending to said metal interconnection layer;

designing the mask to interconnect the PMOS circuit, the NMOS circuit, and the signal line in a first mode; and redesigning the mask to interconnect the PMOS circuit, the NMOS circuit, and the signal line in a second mode; wherein in a first one of the first and second modes, the signal line connects the first drain and the second drain to the second functional block;

in a second one of the first and second modes, different from the first one of the first and second modes, the first space and the second space are left devoid of metal signal lines in said metal interconnection layer in third one of the first and second modes, the PMOS circuit and the NMOS circuit operate to invert the signal so that it reaches the second functional block with an inverted logic level; and in a fourth one of the first and second modes, different from the third one of the first and second modes, the signal reaches the second functional block with the signal's original logic level.

12. The method of claim 11, wherein:

designing the mask includes causing the signal line to extend continuously from the first functional block to the second functional block; and redesigning the mask includes causing an intermediate part of the signal line to be removed, thereby dividing the signal line into a first part receiving the signal from the first functional block and a second part transmitting the signal to the second functional block.

13. The method of claim 11, wherein:
designing the mask includes causing the signal line to comprise a first part receiving the signal from the first functional block and a second part transmitting the signal to the second functional block, the second part being non-contiguous with the first part; and
redesigning the mask includes causing the first and second parts of the signal line to be joined into a single part extending continuously from the first functional block to the second functional block.

14. The method of claim 11, wherein the integrated circuit also includes a power supply pattern and a ground pattern, and
designing the mask includes
causing the first source and the first drain to be connected to the power supply pattern, and
causing the second source and the second drain to be connected to the ground pattern, and
redesigning the mask includes
causing the first drain to be disconnected from the power supply pattern, and
causing the second drain to be disconnected from the ground pattern.

15. The method of claim 11, wherein the integrated circuit also includes a power supply pattern and a ground pattern, and
designing the mask includes
causing the first source to be connected to the power supply pattern,
causing the first drain to be disconnected from the power supply pattern,
causing the second source to be connected to the ground pattern, and
causing the second drain to be disconnected from the ground pattern, and
redesigning the mask includes
causing the first source and the first drain to be connected to the power supply pattern, and
causing the second source and the second drain to be connected to the ground pattern.

16. The method of claim 11, wherein:
designing the mask includes causing the first and second gates to be disconnected from the signal line; and
redesigning the mask includes causing the first and second gates to be connected to the signal line.

17. The method of claim 11, wherein:
designing the mask includes causing the first and second gates to be connected to the signal line; and
redesigning the mask includes causing the first and second gates to be disconnected from the signal line.

18. The method of claim 11, wherein:
the PMOS circuit also includes a third gate and a third drain, the first source being disposed between the first and third gates;
the NMOS circuit also includes a fourth gate and a fourth drain, the second source being disposed between the second and fourth gates; and
the signal line includes a first part connecting the first functional block to the third and fourth gates, and a second part connected to the second functional block.

19. The method of claim 18, wherein:
designing the mask includes causing the second part of the signal line to be connected to the third and fourth drains; and
redesigning the mask includes
causing the second part of the signal line to be disconnected from the third and fourth drains and connected to the first and second drains, and
causing the first and second gates to be commonly connected to the third and fourth drains.

20. The method of claim 18, wherein:
designing the mask includes
causing the second part of the signal line to be connected to the first and second drains, and
causing the first and second gates to be commonly connected to the third and fourth drains; and
redesigning the mask includes
causing the second part of the signal line to be disconnected from the first and second drains, and
causing the second part of the signal line to be connected to the third and fourth drains.

* * * * *